US012660553B2

(12) United States Patent
    Satyavolu et al.

(10) Patent No.: US 12,660,553 B2
(45) Date of Patent: Jun. 16, 2026

(54) HIGH TEMPERATURE AND VACUUM ISOLATION PROCESSING MINI-ENVIRONMENTS

(71) Applicant: Applied Materials, Inc., Santa Clara, CA (US)

(72) Inventors: Nitin Bharadwaj Satyavolu, Kakinada (IN); Kirankumar Neelasandra Savandaiah, Bangalore (IN); Hari Prasath Rajendran, Coimbatore (IN); Srinivasa Rao Yedla, Bangalore (IN); Lakshmikanth Krishnamurthy Shirahatti, Bangalore (IN); Thomas Brezoczky, Los Gatos, CA (US); Keith A. Miller, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 146 days.

(21) Appl. No.: 16/889,599

(22) Filed: Jun. 1, 2020

(65) Prior Publication Data
    US 2021/0375650 A1    Dec. 2, 2021

(51) Int. Cl.
    *H01L 21/67* (2006.01)
    *H01L 21/673* (2006.01)
    *H01L 21/683* (2006.01)

(52) U.S. Cl.
    CPC .. *H01L 21/67167* (2013.01); *H01L 21/67155* (2013.01); *H01L 21/6719* (2013.01);
    (Continued)

(58) Field of Classification Search
    CPC ..................... H01L 21/6719; H01L 21/68742
    See application file for complete search history.

(56) References Cited

U.S. PATENT DOCUMENTS

| 5,863,170 A | 1/1999 | Boitnott et al. |
| 5,879,459 A | 3/1999 | Gadgil et al. |

(Continued)

FOREIGN PATENT DOCUMENTS

| CN | 100411095 C | 8/2008 |
| CN | 101841006 A | 9/2010 |

(Continued)

OTHER PUBLICATIONS

PCT International Search Report and Written Opinion dated Jul. 23, 2021, for International Application No. PCT/US2021/026701.

(Continued)

*Primary Examiner* — Parviz Hassanzadeh
*Assistant Examiner* — Nathan K Ford
(74) *Attorney, Agent, or Firm* — Patterson + Sheridan, LLP

(57) ABSTRACT

A method and apparatus for substrate processing and a cluster tool including a transfer chamber assembly and a plurality of processing assemblies. The transfer chamber assembly and processing assemblies may include processing platforms for ALD, CVD, PVD, etch, cleaning, implanting, heating, annealing, and/or polishing processes. Processing chamber volumes are sealed from the transfer chamber volume using a support chuck on which a substrate is disposed thereon. The support chuck is raised to form an isolation seal between the processing chamber volume and the transfer chamber volume using a bellows assembly and a chuck sealing surface.

13 Claims, 16 Drawing Sheets

(52) U.S. Cl.
CPC .. *H01L 21/67196* (2013.01); *H01L 21/67376*
(2013.01); *H01L 21/6833* (2013.01); *H01L*
*21/67219* (2013.01)

(56) References Cited

U.S. PATENT DOCUMENTS

| | | | |
|---|---|---|---|
| 6,162,299 A | 12/2000 | Raaijmakers | |
| 6,440,261 B1 | 8/2002 | Tepman et al. | |
| 6,447,607 B2 | 9/2002 | Soininen et al. | |
| 6,576,062 B2 | 6/2003 | Matsuse | |
| 6,604,853 B2 | 8/2003 | Chao et al. | |
| 6,635,115 B1 | 10/2003 | Fairbairn et al. | |
| 6,852,194 B2 | 2/2005 | Matsushita et al. | |
| 6,962,471 B2 | 11/2005 | Birkner et al. | |
| 7,066,703 B2 | 6/2006 | Johnson | |
| 7,090,741 B2 | 8/2006 | Narushima et al. | |
| D527,751 S | 9/2006 | Kondoh et al. | |
| 7,138,336 B2 | 11/2006 | Lee et al. | |
| 7,169,234 B2 | 1/2007 | Weeks et al. | |
| 7,189,432 B2 | 3/2007 | Chiang et al. | |
| 7,258,768 B2 | 8/2007 | Yamazaki | |
| 7,318,869 B2 | 1/2008 | Chiang et al. | |
| 7,422,406 B2 | 9/2008 | van der Meulen | |
| 7,458,763 B2 | 12/2008 | van der Meulen | |
| 7,537,662 B2 | 5/2009 | Soininen et al. | |
| 7,784,164 B2 | 8/2010 | White et al. | |
| 7,799,179 B2 | 9/2010 | Maass et al. | |
| 7,806,983 B2 | 10/2010 | Chiang et al. | |
| 7,833,352 B2 | 11/2010 | Bondestam et al. | |
| 7,905,991 B2 | 3/2011 | Esselbach et al. | |
| 7,959,403 B2 | 6/2011 | van der Meulen | |
| 7,988,399 B2 | 8/2011 | van der Meulen | |
| 8,029,226 B2 | 10/2011 | van der Meulen | |
| 8,033,772 B2 | 10/2011 | Kurita et al. | |
| 8,088,678 B2 | 1/2012 | Kitano et al. | |
| 8,197,177 B2 | 6/2012 | van der Meulen et al. | |
| 8,216,380 B2 | 7/2012 | White et al. | |
| 8,267,632 B2 | 9/2012 | van der Meulen et al. | |
| 8,292,563 B2 | 10/2012 | Haris | |
| 8,313,277 B2 | 11/2012 | van der Meulen et al. | |
| 8,354,656 B2 | 1/2013 | Beloussov et al. | |
| 8,403,613 B2 | 3/2013 | van der Meulen | |
| 8,434,989 B2 | 5/2013 | van der Meulen | |
| 8,439,623 B2 | 5/2013 | van der Meulen | |
| 8,500,388 B2 | 8/2013 | van der Meulen et al. | |
| 8,523,507 B2 | 9/2013 | van der Meulen | |
| 8,558,299 B2 | 10/2013 | Cao et al. | |
| 8,574,409 B2 | 11/2013 | Kadlec et al. | |
| 8,602,716 B2 | 12/2013 | van der Meulen et al. | |
| 8,672,605 B2 | 3/2014 | van der Meulen et al. | |
| 8,696,298 B2 | 4/2014 | van der Meulen et al. | |
| 8,728,239 B2 | 5/2014 | Bauer et al. | |
| 8,807,905 B2 | 8/2014 | Meulen | |
| 8,812,150 B2 | 8/2014 | van der Meulen et al. | |
| 8,870,513 B2 | 10/2014 | Voser et al. | |
| 8,870,514 B2 | 10/2014 | van der Meulen et al. | |
| 8,895,450 B2 | 11/2014 | Cao et al. | |
| 8,944,738 B2 | 2/2015 | van der Meulen | |
| 8,945,308 B2 | 2/2015 | Schaller | |
| 9,005,539 B2 | 4/2015 | Halpin et al. | |
| 9,085,825 B2 | 7/2015 | Kim | |
| 9,103,030 B2 | 8/2015 | Kato et al. | |
| 9,214,589 B2 | 12/2015 | Voser et al. | |
| 9,252,037 B2 | 2/2016 | Scholte Von Mast et al. | |
| 9,281,222 B2 | 3/2016 | Weaver et al. | |
| 9,336,997 B2 | 5/2016 | Bera | |
| 9,340,874 B2 | 5/2016 | Halpin et al. | |
| 9,347,131 B2 | 5/2016 | Maass et al. | |
| 9,355,824 B2 | 5/2016 | Kadlec et al. | |
| 9,378,994 B2 | 6/2016 | Weaver et al. | |
| 9,396,981 B2 | 7/2016 | Scholte Von Mast et al. | |
| 9,443,749 B2 | 9/2016 | Wakabayashi et al. | |
| 9,478,420 B2 | 10/2016 | Castaldi et al. | |
| 9,490,149 B2 | 11/2016 | Chandrasekharan et al. | |
| 9,551,068 B2 | 1/2017 | Kumagai et al. | |
| 9,583,349 B2 | 2/2017 | Gandikota et al. | |
| 9,587,306 B2 | 3/2017 | Rohrmann et al. | |
| 9,644,261 B2 | 5/2017 | Weichart et al. | |
| 9,698,009 B2 | 7/2017 | Sato et al. | |
| 9,831,094 B2 | 11/2017 | Rahtu et al. | |
| 9,842,755 B2 | 12/2017 | Ocker et al. | |
| 9,884,726 B2 | 2/2018 | van der Meulen et al. | |
| 9,890,473 B2 | 2/2018 | Newman | |
| 9,929,008 B2 | 3/2018 | Wamura et al. | |
| 9,932,674 B2 | 4/2018 | Kato et al. | |
| 9,953,843 B2 | 4/2018 | Shen et al. | |
| 9,960,072 B2 | 5/2018 | Coomer | |
| 10,043,693 B1 | 8/2018 | Kim et al. | |
| 10,086,511 B2 | 10/2018 | van der Meulen | |
| 10,138,553 B2 | 11/2018 | Scholte Von Mast et al. | |
| 10,145,014 B2 | 12/2018 | Nozawa et al. | |
| 10,202,682 B2 | 2/2019 | Rieschl et al. | |
| 10,202,687 B2 | 2/2019 | Miura et al. | |
| 10,221,480 B2 | 3/2019 | Kato et al. | |
| 10,256,125 B2 | 4/2019 | Weaver et al. | |
| 10,262,888 B2 | 4/2019 | Gangakhedkar et al. | |
| 10,347,515 B2 | 7/2019 | Heinz | |
| 10,388,559 B2 | 8/2019 | Rieschl et al. | |
| 10,427,303 B2 | 10/2019 | Weaver et al. | |
| 10,586,720 B2 | 3/2020 | Weaver et al. | |
| 2002/0051698 A1 | 5/2002 | Birkner et al. | |
| 2002/0108842 A1 | 8/2002 | Bonora et al. | |
| 2002/0170671 A1 | 11/2002 | Matsushita et al. | |
| 2003/0109094 A1 | 6/2003 | Seidel et al. | |
| 2004/0159553 A1 | 8/2004 | Nogami et al. | |
| 2004/0261710 A1 | 12/2004 | Matsushita et al. | |
| 2005/0005850 A1 | 1/2005 | Yamazaki | |
| 2005/0006230 A1 | 1/2005 | Narushima et al. | |
| 2005/0111936 A1 | 5/2005 | Kim et al. | |
| 2005/0115822 A1 | 6/2005 | Maass et al. | |
| 2005/0118009 A1 | 6/2005 | van der Meulen | |
| 2006/0051507 A1 | 3/2006 | Kurita et al. | |
| 2006/0056952 A1 | 3/2006 | Haris | |
| 2006/0101728 A1 | 5/2006 | White et al. | |
| 2006/0137608 A1 | 6/2006 | Choi et al. | |
| 2006/0137609 A1 | 6/2006 | Puchacz et al. | |
| 2006/0157340 A1 | 7/2006 | Kurita et al. | |
| 2006/0201074 A1 | 9/2006 | Kurita et al. | |
| 2006/0263177 A1 | 11/2006 | Meulen | |
| 2007/0020890 A1 | 1/2007 | Thakur et al. | |
| 2007/0197062 A1* | 8/2007 | Bagley .............. H01L 21/67294 |
| | | | 439/106 |
| 2007/0215036 A1 | 9/2007 | Park et al. | |
| 2007/0281090 A1 | 12/2007 | Kurita et al. | |
| 2008/0014055 A1 | 1/2008 | van der Meulen | |
| 2008/0072821 A1 | 3/2008 | Dalton et al. | |
| 2008/0124194 A1 | 5/2008 | van der Meulen et al. | |
| 2008/0124197 A1 | 5/2008 | van der Meulen et al. | |
| 2008/0138176 A1 | 6/2008 | Kim et al. | |
| 2008/0187417 A1 | 8/2008 | van der Meulen et al. | |
| 2008/0219808 A1 | 9/2008 | van der Meulen et al. | |
| 2008/0219812 A1 | 9/2008 | van der Meulen et al. | |
| 2008/0226429 A1 | 9/2008 | van der Meulen | |
| 2008/0232947 A1 | 9/2008 | van der Meulen et al. | |
| 2009/0087286 A1 | 4/2009 | Meulen | |
| 2009/0173622 A1 | 7/2009 | Weichart et al. | |
| 2009/0180847 A1 | 7/2009 | Guo et al. | |
| 2010/0012036 A1 | 1/2010 | Silva et al. | |
| 2010/0075453 A1 | 3/2010 | Kurita et al. | |
| 2010/0120238 A1 | 5/2010 | Kitano et al. | |
| 2010/0202860 A1* | 8/2010 | Reed ................ H01L 21/68764 |
| | | | 414/221 |
| 2010/0236691 A1 | 9/2010 | Yamazaki | |
| 2010/0281683 A1 | 11/2010 | White et al. | |
| 2010/0304027 A1 | 12/2010 | Lee et al. | |
| 2010/0327187 A1 | 12/2010 | Beloussov et al. | |
| 2012/0027542 A1 | 2/2012 | Somura et al. | |
| 2012/0031749 A1 | 2/2012 | Dubs et al. | |
| 2012/0328797 A1 | 12/2012 | Maass et al. | |
| 2013/0270107 A1 | 10/2013 | Ewert et al. | |
| 2013/0287527 A1 | 10/2013 | Scholte Von Mast et al. | |
| 2013/0302115 A1 | 11/2013 | Wakabayashi et al. | |
| 2014/0262035 A1 | 9/2014 | Merry et al. | |

(56) References Cited

U.S. PATENT DOCUMENTS

| | | | |
|---|---|---|---|
| 2014/0349011 A1* | 11/2014 | Weichart | H01L 21/67751 |
| | | | 427/248.1 |
| 2015/0063957 A1 | 3/2015 | Olgado | |
| 2015/0240360 A1* | 8/2015 | Leeser | H01L 21/6719 |
| | | | 118/723 R |
| 2016/0108515 A1 | 4/2016 | Elghazzali et al. | |
| 2016/0138159 A1 | 5/2016 | Kato et al. | |
| 2017/0175247 A1 | 6/2017 | Weichart | |
| 2017/0218514 A1 | 8/2017 | Kato et al. | |
| 2018/0142350 A1 | 5/2018 | Fukiage et al. | |
| 2018/0195173 A1 | 7/2018 | Kato et al. | |
| 2018/0211820 A1 | 7/2018 | Krishna et al. | |
| 2018/0226228 A1* | 8/2018 | Toyoda | C23C 16/5096 |
| 2018/0245212 A1 | 8/2018 | Schwyn-Thony et al. | |
| 2018/0245218 A1 | 8/2018 | Kato | |
| 2018/0261473 A1 | 9/2018 | Weichart et al. | |
| 2018/0308737 A1* | 10/2018 | Moriya | H01L 21/68742 |
| 2018/0334745 A1 | 11/2018 | Kato | |
| 2019/0013225 A1 | 1/2019 | Taguchi et al. | |
| 2019/0096715 A1 | 3/2019 | Lodder et al. | |
| 2019/0237311 A1 | 8/2019 | Allen et al. | |
| 2019/0252160 A1 | 8/2019 | Balon et al. | |
| 2019/0252166 A1 | 8/2019 | Felzer et al. | |
| 2020/0020550 A1 | 1/2020 | Goshi et al. | |
| 2020/0118809 A1 | 4/2020 | Reddy et al. | |
| 2021/0354934 A1 | 11/2021 | Aust et al. | |
| 2021/0358780 A1* | 11/2021 | Mori | H01L 21/67742 |
| 2022/0208426 A1 | 6/2022 | Aust et al. | |

FOREIGN PATENT DOCUMENTS

| | | | |
|---|---|---|---|
| CN | 103493180 A | 1/2014 | |
| CN | 102965643 B | 2/2016 | |
| CN | 105200393 B | 10/2018 | |
| CN | 111108228 A | 5/2020 | |
| DE | 10350517 A1 | 6/2005 | |
| DE | 102012103295 A1 | 7/2013 | |
| DE | 102013111790 A1 | 4/2015 | |
| DE | 102013113052 A1 | 5/2015 | |
| EP | 272141 A2 | 6/1988 | |
| EP | 2102889 A2 | 9/2009 | |
| JP | H3213139 A | 9/1991 | |
| JP | 200021946 A | 1/2000 | |
| JP | 2001102423 A | 4/2001 | |
| JP | 2007107047 A | 4/2007 | |
| JP | 5088284 B2 | 12/2012 | |
| JP | 5315898 B2 | 10/2013 | |
| JP | 5544697 B2 | 7/2014 | |
| JP | 5870568 B2 | 3/2016 | |
| JP | 2017069428 A | 4/2017 | |
| JP | 6330623 B2 | 5/2018 | |
| JP | 2018190776 A | 11/2018 | |
| JP | 6464765 B2 | 2/2019 | |
| JP | 6478847 B2 | 3/2019 | |
| JP | 2019036630 A | 3/2019 | |
| KR | 101887072 B1 | 8/2018 | |
| KR | 20190030415 A | 3/2019 | |
| KR | 20220099611 A | 7/2022 | |
| WO | 0137317 A1 | 5/2001 | |
| WO | 2017212077 A2 | 12/2017 | |
| WO | 2018197305 A2 | 11/2018 | |
| WO | 2019020391 A1 | 1/2019 | |
| WO | 2019020393 A1 | 1/2019 | |
| WO | 2019052657 A1 | 3/2019 | |
| WO | 2019096515 A1 | 5/2019 | |
| WO | 2019096564 A1 | 5/2019 | |
| WO | 2019105671 A1 | 6/2019 | |

OTHER PUBLICATIONS

International Search Report and Written Opinion dated Sep. 4, 2020 for Application No. PCT/US2020/033456.

Office Action for Korean Application No. 10-2022-7046374 dated Apr. 25, 2024.

Taiwan Office Action dated Jul. 31, 2024 for Application No. 110114093.

Japanese Office Action dated Apr. 3, 2024 re JP Application No. 2022-572281.

Office Action for Japanese Applcation No. 2024-187212 dated Sep. 30, 2025.

* cited by examiner

HIGH TEMPERATURE AND VACUUM ISOLATION PROCESSING MINI-ENVIRONMENTS

BACKGROUND

Field

Embodiments described herein generally relate to methods and apparatus for processing substrates. More particularly, embodiments of the disclosure relate to substrate processing platforms, which employ multiple processing chambers for processing substrates therein.

Description of the Related Art

Conventional cluster tools for the processing of substrates by deposition of materials thereon, the etching of substrates or materials thereon, or other processes used during the fabrication of integrated circuit chips, are configured to perform one or more processes during substrate processing therein. For example, a cluster tool can include a physical vapor deposition (PVD) chamber to perform a PVD process on a substrate, an atomic layer deposition (ALD) chamber for performing an ALD process on a substrate, a chemical vapor deposition (CVD) chamber for performing a CVD process on a substrate, an etch chamber for performing an etch process on a substrate, a thermal processing chamber for performing a thermal process on a substrate, a plasma ion implant chamber for implanting ions into a substrate or a film layer formed thereon, and/or one or more other processing chambers.

The aforementioned cluster tools have limitations, such as mechanical limits on the throughput of substrates therein, the level of particulates (particles) present in the substrate processing environment, and restrictions on process conditions within process chambers on the cluster tool. Therefore, what is needed in the art is a cluster tool capable of improving the mechanical throughput, decreasing the level of particulates present in the substrate processing environment, and increasing process condition flexibility between process chambers within the same cluster tool.

Described herein are substrate processing apparatuses, which use multiple processing assemblies for processing substrates.

SUMMARY

The present disclosure generally relates to towards apparatus for substrate processing and a cluster tool including a transfer chamber assembly and a plurality of processing assemblies.

In one embodiment, an apparatus for simultaneously process a plurality of substrates is described. The apparatus includes a transfer chamber assembly having one or more walls that define a transfer volume, a support chuck having a substrate supporting surface, a sealing ring having a chuck sealing surface, and a plurality of processing assemblies disposed in the transfer chamber assembly. The chuck sealing surface is disposed around the substrate supporting surface of the support chuck. Each of the processing assemblies comprise a one or more process chamber walls, and a lift assembly. The process chamber walls have a upper sealing surface and the lift assembly to move the support chuck between a transfer position and a processing position. The upper sealing surface forms an isolation seal with the chuck sealing surface and forms a sealed process chamber volume, that is fluidly isolated from the transfer volume, between the one or more process chamber walls and the support chuck when the support chuck is in the processing position. The transfer volume is in fluid communication with the process chamber volume when the support chuck is in the transfer position.

In another embodiment, another apparatus for simultaneously process a plurality of substrates is described. The apparatus includes a transfer chamber assembly having one or more walls that define a transfer volume, a support chuck having a substrate supporting surface, a sealing ring having a chuck sealing surface, a plurality of processing assemblies disposed in the transfer chamber assembly, and a lift assembly. The chuck sealing surface is disposed around the substrate supporting surface of the support chuck. Each of the processing assemblies comprise one or more process chamber walls. The one or more process chamber walls have a upper sealing surface and the lift assembly moves the support chuck between a transfer position and a processing position. The upper sealing surface forms an isolation seal with the chuck sealing surface and forms a sealed process chamber volume, that is fluidly isolated from the transfer volume, between the one or more process chamber walls and the support chuck when the support chuck is in the processing position. The transfer volume is in fluid communication with the process chamber volume when the support chuck is in the transfer position. A robotic transfer device is positioned within the transfer chamber assembly and transfers a substrate between the plurality of processing assemblies within the transfer assembly.

In yet another embodiment, a method of processing a substrate is described. The method includes positioning a substrate and a support chuck into a first position on a robotic transfer device within a transfer volume. The lift assembly is then raised to couple to the support chuck. The support chuck is disengaging from the robotic transfer device and raised to a second position with the lift assembly. The chuck sealing surface is sealed against a upper sealing surface to form a chamber volume, such that the chamber volume is fluidly isolated from the transfer volume. The substrate is then processes in the chamber volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Embodiments of the present disclosure are directed towards apparatus for substrate processing and a cluster tool including a transfer chamber assembly and a plurality of processing assemblies. The transfer chamber assembly and processing assemblies may include processing platforms for ALD, CVD, PVD, etch, cleaning, implanting, heating, annealing, and/or polishing processes. Other processing platforms may also be used with the present disclosure. The present disclosure generally provides a substrate processing tool with increased process condition flexibility between process assemblies within the same cluster tool.

The present disclosure includes embodiments for substrate processing. A substrate and optionally a support chuck may be transported between processing assemblies within a transfer volume formed by a transfer chamber assembly. The processing assemblies include processing volumes in which the substrate is processed. The support chuck may optionally detach from a lift assembly while being transported between processing assemblies. When the substrate and the support chuck are disposed on the lift assembly, the lift assembly raises the substrate and support chuck to an upper processing position. While in the upper processing position, surfaces of the processing assembly and the support chuck seal against one another to form a fluidly isolated processing volume. The processing volume is fluidly isolated from the transfer volume formed by the transfer chamber assembly.

The isolation of the processing volume from the transfer volume by the movement of the lift assembly allows for each of the processing volumes to be adjusted to different pressures. This enables different substrate processing steps to be performed within each of the processing assemblies within the transfer chamber assembly even when each processing step requires different pressures and temperatures. The use of the support chuck as the sealing member within the processing assembly also minimizes the volume of the processing volume. Minimizing the processing volume decreases the amount of process gases and purge gases required during each process. The sealing between each processing volume and the transfer volume additionally minimizes process gas leakage into the transfer chamber. The apparatus and method utilized to create the seal between the processing volumes and the transfer volume minimize particle contamination within the processing volumes and decrease downtime of the apparatus caused by part replacement and cleaning.

Figure 1A:
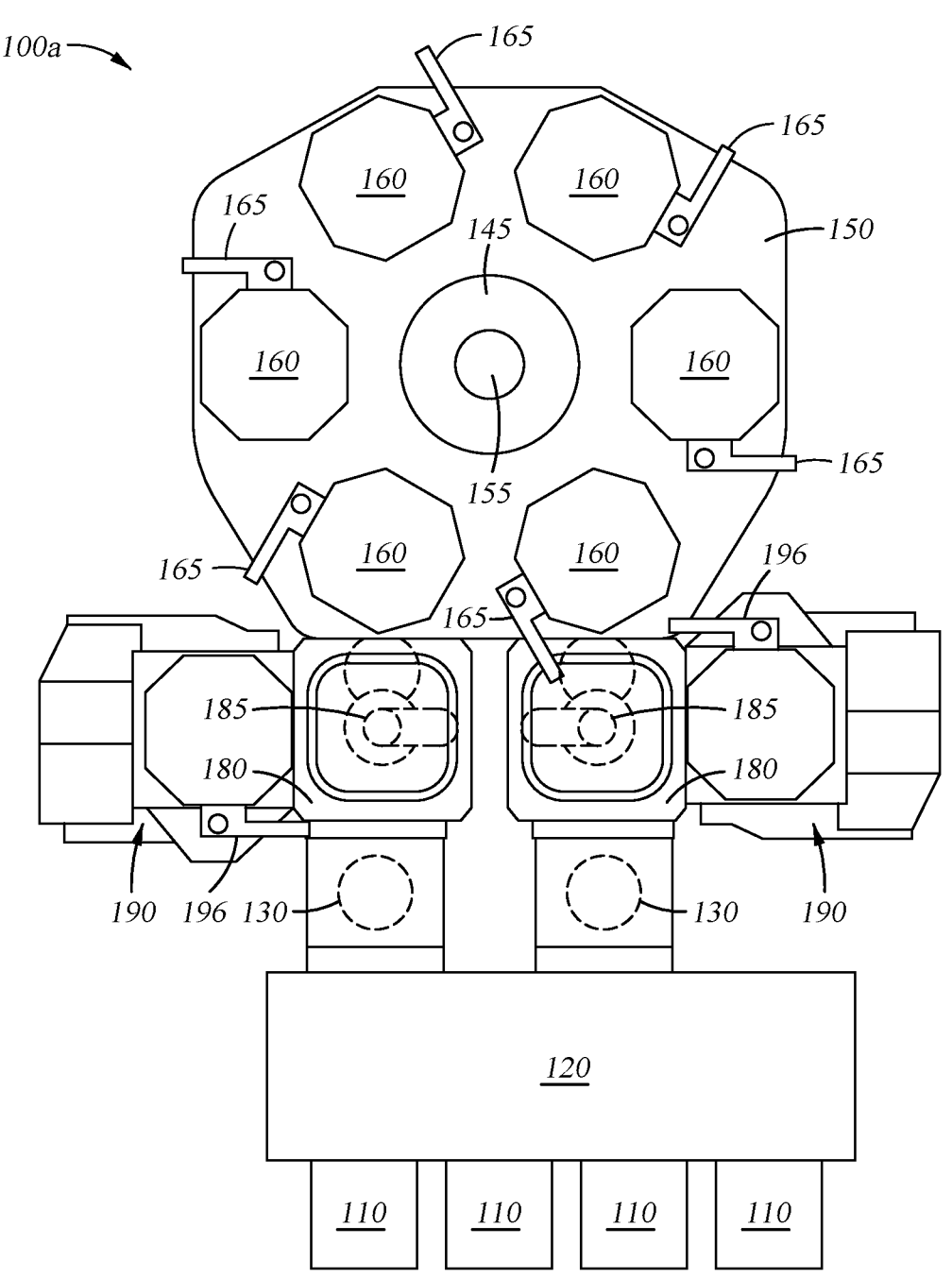
FIGS. 1A-1B are plan views of cluster tool assemblies with transfer chamber assemblies and processing assemblies as described herein.
Figure 1B:
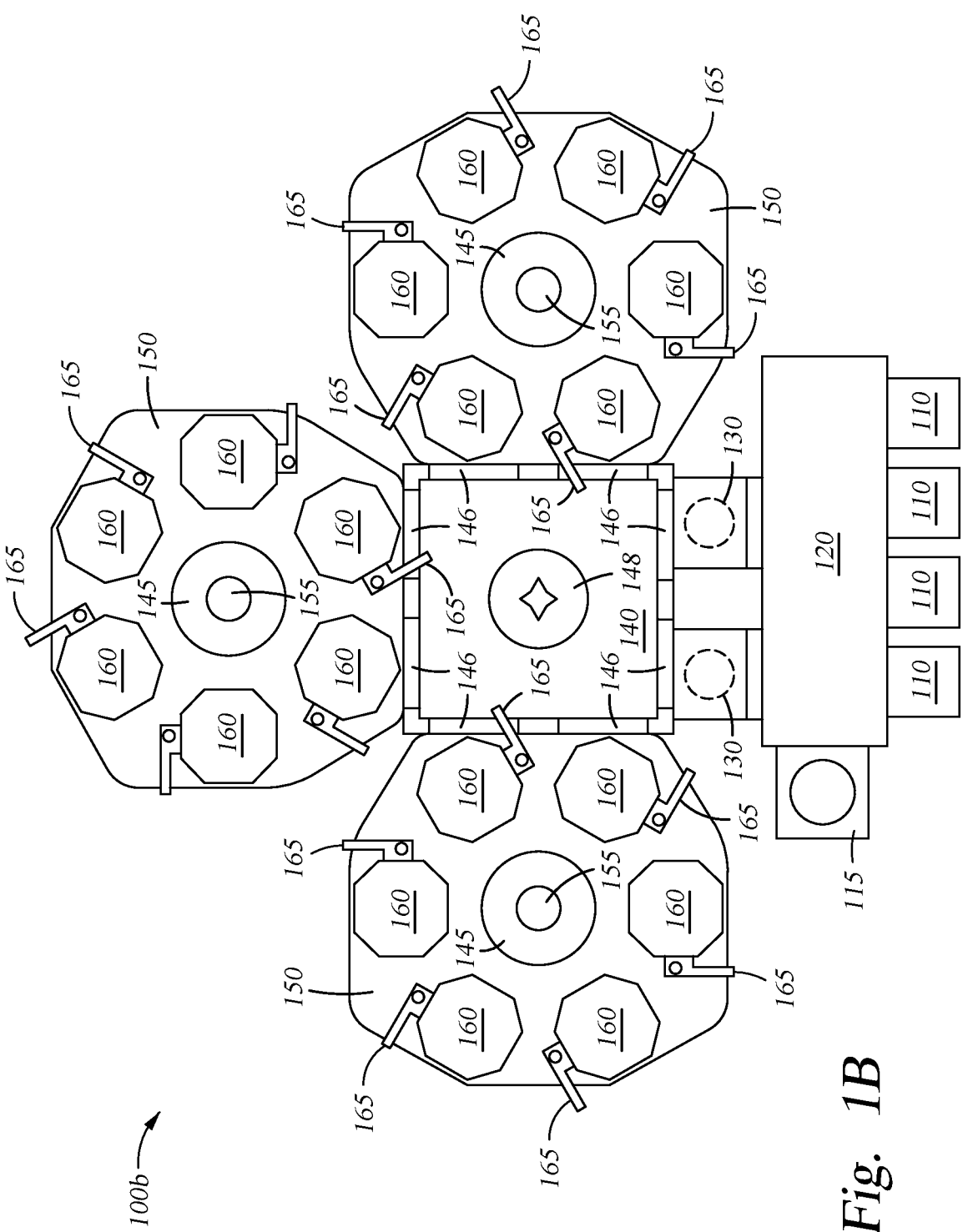

FIGS. 1A-1B are plan views of cluster tool assemblies 100a, 100b with transfer chamber assemblies 150 and processing assemblies 160 as described herein. The cluster tool assembly 100a of FIG. 1A includes a single transfer chamber assembly 150 and a plurality of front end robot chambers 180 between the transfer chamber assembly 150 and load lock chambers 130. The cluster tool assembly 100b of FIG. 1B includes multiple transfer chamber assemblies 150 and a buffer chamber 140 disposed between the transfer chamber assemblies 150 and load lock chambers 130.

In FIG. 1A, the cluster tool assembly 100a includes Front Opening Unified Pods (FOUPs) 110, a Factory Interface (FI) 120 adjacent to and operably connected to the FOUPs 110, load lock chambers 130 adjacent to and operably connected to the FI 120, front end robot chambers 180 adjacent to and operatively connected to the load lock chambers 130, prep chambers 190 adjacent to and operatively connected to the front end robot chambers 180, and a transfer chamber assembly 150 connected to the front end robot chambers 180.

The FOUPs 110 are utilized to safely secure and store substrates during movement thereof between different substrate processing equipment, as well as during the connection of the FOUPs to the substrate processing equipment while the substrates are disposed therein. The number of FOUPs 110 (four shown) may vary in quantity depending upon the processes run in the cluster tool assembly 100a. The throughput of the cluster tool assembly 100a also, at least in part, defines the number of docking stations on the FI 120 to which the FOUPs are connected for the unloading of substrates therefrom and the loading of substrates thereinto. The FI 120 is disposed between the FOUPs 110 and the load lock chambers 130. The FI 120 creates an interface between a semiconductor fabrication facility (Fab) and the cluster tool assembly 100a. The FI 120 is connected to the load lock chambers 130, such that substrates are transferred from the FI 120 to the load lock chambers 130 and from the load lock chambers 130 and into the FI 120.

The front end robot chambers 180 are located on the same side of each of the load lock chambers 130, such that the load lock chambers 130 are located between the FI 120 and the front end robot chambers 180. The front end robot chambers 180 each include a transfer robot 185 therein. The transfer robot 185 is any robot suitable to transfer one or more substrates from one chamber to another, through or via the front end robot chamber 180. In some embodiments, as shown in FIG. 1A, the transfer robot 185 within each front end robot chamber 180 is configured to transport substrates from one of the load lock chambers 130 and into one of the prep chambers 190.

The prep chambers 190 may be any one of a pre-clean chamber, an anneal chamber, or a cool down chamber, depending upon the desired process within the cluster tool assembly 100a. In some embodiments, the prep chambers 190 are plasma clean chambers. In yet other exemplary embodiments, the prep chambers 192 are Preclean II chambers available from Applied Materials, Inc., of Santa Clara, Calif. A vacuum pump 196 is positioned adjacent to each of the prep chambers 192. The vacuum pumps 196 are configured to pump the prep chambers 190 to a predetermined pressure. In some embodiments, the vacuum pump 196 is configured to decrease the pressure of the prep chamber 192, such as to create a vacuum within the prep chamber 192.

As shown in FIG. 1A, two load lock chambers 130, two front end robot chambers 180, and two prep chambers 190 are configured within the cluster tool assembly 100a. The two load lock chambers 130, the two front end robot chambers 180, and the two prep chambers 190, when arranged as shown in FIG. 1A and described above, may form two transport assemblies. The two transport assemblies may be spaced from each other and may form mirror images of one another, such that the prep chambers 190 are on opposite walls of their respective front end robot chambers 180.

The transfer chamber assembly 150 is adjacent to, and operatively connected to, the front end robot chambers 180, such that substrates are transferred between the transfer chamber assembly 150 and front end robot chambers 180. The transfer chamber assembly 150 includes a central transfer device 145 and a plurality of processing assemblies 160 therein. The plurality of processing assemblies 160 are disposed around the central transfer device 145, radially outward of a pivot or central axis of the central transfer device 145 in the transfer chamber assembly 150.

A chamber pump 165 is disposed adjacent to, and in fluid communication with, each of the processing assemblies 160, such that there are a plurality of chamber pumps 165 disposed around the central transfer device 145. The plurality of chamber pumps 165 are disposed radially outward of the central transfer device 145 in the transfer chamber assembly 150. As shown in FIG. 1A, one chamber pump 165 is fluidly coupled to each of the processing assemblies 160.

In some embodiments, there may be multiple chamber pumps 165 fluidly coupled to each processing assembly 160. In yet other embodiments, one or more of the processing assemblies 160 may not have a chamber pump 165 directly fluidly coupled thereto. In some embodiments a varying number of chamber pumps 165 are fluidly coupled to each processing assembly 160, such that one or more processing assemblies 160 may have a different number of chamber pumps 165 than one or more other processing assemblies 160. The chamber pumps 165 enable separate vacuum pumping of processing regions within each processing assembly 160, and thus the pressure within each of the processing assemblies may be maintained separately from one another and separately from the pressure present in the transfer chamber assembly 150.

FIG. 1A depicts an embodiment having six processing assemblies 160 within the transfer chamber assembly 150. However, other embodiments may have a different number of processing assemblies 160 within the transfer chamber 150. For example, in some embodiments, two to twelve processing assemblies 160 may be positioned within the transfer chamber assembly 150, such as four to eight processing assemblies 160. In other embodiments, four processing assemblies 160 may be positioned within the transfer chamber assembly 150. The number of processing assemblies 160 impact the total footprint of the cluster tool 100a, the number of possible process steps capable of being performed by the cluster tool 100a, the total fabrication cost of the cluster tool 100a, and the throughput of the cluster tool 100a.

Each of the processing assemblies 160 can be any one of PVD, CVD, ALD, etch, cleaning, heating, annealing, and/or polishing platforms. In some embodiments, the processing assemblies 160 are all one type of processing platform. In other embodiments, the processing assemblies 160 includes two or more different processing platforms. In one exemplary embodiment, all of the processing assemblies 160 are PVD process chambers. In another exemplary embodiment, the processing assemblies 160 includes both PVD and CVD process chambers. The plurality of processing assemblies 160 can be altered to match the types of process chambers needed to complete a semiconductor fabrication process.

The central transfer device 145 is disposed at generally the center of the transfer chamber assembly 150, such that a central axis 155 of the transfer chamber assembly 150 is disposed through the central transfer device 145. The central transfer device 145, is any suitable transfer device configured to transport substrates between each of the processing assemblies 160. In one embodiment, the central transfer device 145 is a central robot having one or more blades configured to transport substrates between each processing assembly 160. In another embodiment, the central transfer device is a carousel system by which processing regions are moved along a circular orbital path centered on the central axis 155 of the transfer chamber assembly 150.

FIG. 1B is a plan view of the cluster tool 100b with multiple transfer chamber assemblies 150 connected thereto. The FOUPs 110, FI 120, and load lock chambers 130 may be arranged similarly to the FOUPs 110, FI 120, and load lock chambers 130 described above in relation to FIG. 1A. The cluster tool 100b of FIG. 1B further includes an FI etch apparatus 115, a buffer chamber 140, and a plurality of transfer chamber assemblies 150.

The FI etch apparatus 115 is positioned adjacent to the FI 120, such that the FI etch apparatus 115 is disposed on a side wall of the FI 120. The FI etch apparatus 115 may be positioned on a side wall of the FI 120 that is separate from the side walls of the FI that are connected to the FOUPs 110 and the load lock chambers 130. The FI etch apparatus 115 may be an etch chamber. The FI etch apparatus 115 may be similar to the Centris® line of etch chambers available from Applied Materials, Inc.

The buffer chamber 140 is located between the load lock chambers 130 and the plurality of transfer chamber assemblies 150 and provides an isolatable volume through which substrates may be transferred among and between the load lock chambers 130 and the multiple transfer chamber assemblies 150. The buffer chamber 140 is coupled to both the load lock chambers 130 and the plurality of transfer chamber assemblies 150. As shown in FIG. 1B, three transfer chamber assemblies 150 are disposed around and attached to the buffer chamber 140. In other embodiments, there may be one, two, or more than three transfer chamber assemblies 150 disposed around the buffer chamber 140.

The buffer chamber 140 includes least one opening 146 along each wall of the buffer chamber 140 that is in contact with a transfer chamber assembly 150 or a load lock chamber 130. Each of the openings 146 is sized to allow the passage of a substrate, a substrate chuck, or a substrate on a substrate chuck to and from the transfer chamber assemblies 150. In some embodiments, there are two openings 146 along each wall of the buffer chamber 140 that is adjacent to the transfer chamber assemblies 150. This allows for the passage of two substrates to the transfer chamber assemblies 150 from the buffer chamber 140 or from the transfer chamber assemblies 150 to the buffer chamber 140 simultaneously.

The buffer chamber 140 includes one or more buffer chamber transfer robots 148. The buffer chamber transfer robots 148 move substrates, chucks, or both substrates and chucks between the transfer chamber assemblies 150 and the load lock chambers 130. The buffer chamber transfer robots 148 may be any suitable substrate transfer robot.

To enable isolation of the buffer chamber 140 internal volume from process gases used in the process assemblies 160 of the transfer chamber assemblies 150, access between each transfer chamber assembly 150, and the openings 146 in the buffer chamber 140 are selectively sealed by a respective fluid isolation valve, such as a slit valve. The fluid isolation valves (not shown) are disposed within the wall of each of the transfer chamber assemblies 150, the wall of the buffer chamber 140, or as a separate assembly between the buffer chamber 140 and the transfer chamber assembly 150. Additionally, the fluid isolation valves may include a plate and seal assembly 292 (FIG. 2A-3B) which is pressed by a selectively operable ram to selectively cover and seal, or uncover, the respective opening 146. The plate and seal assembly 292 thereby selectively seals, or allows, fluid communication between the transfer chamber assembly 150 and the buffer chamber 140 and also allows, when retracted away from an opening 146, a support blade or end effector on the buffer chamber transfer robot 148 in the buffer chamber 140 to transport a substrate through the opening 146.

The transfer chamber assemblies 150 may be configured the same as the one described above in relation to FIG. 1A. This includes the placement and structure of the central transfer devices 145, the plurality of processing assemblies 160, and the chamber pumps 165 within each of the transfer chamber assemblies 150. However, alternative embodiments of the transfer chamber assemblies 150 may be utilized.

Figure 2A:
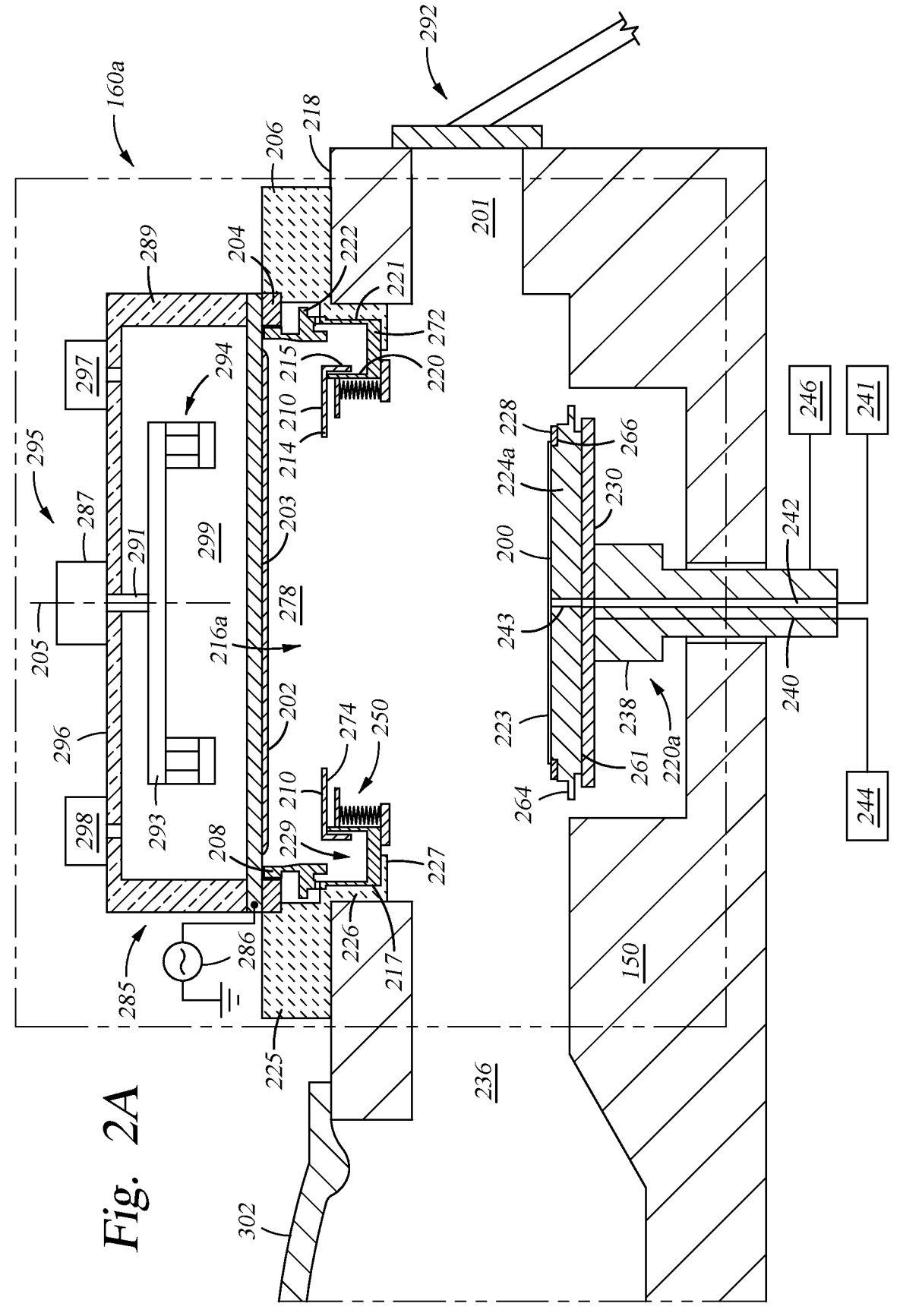
FIG. 2A-2B are schematic cross sectional views of a transfer chamber assembly and a processing assembly according to a first embodiment.
Figure 2B:
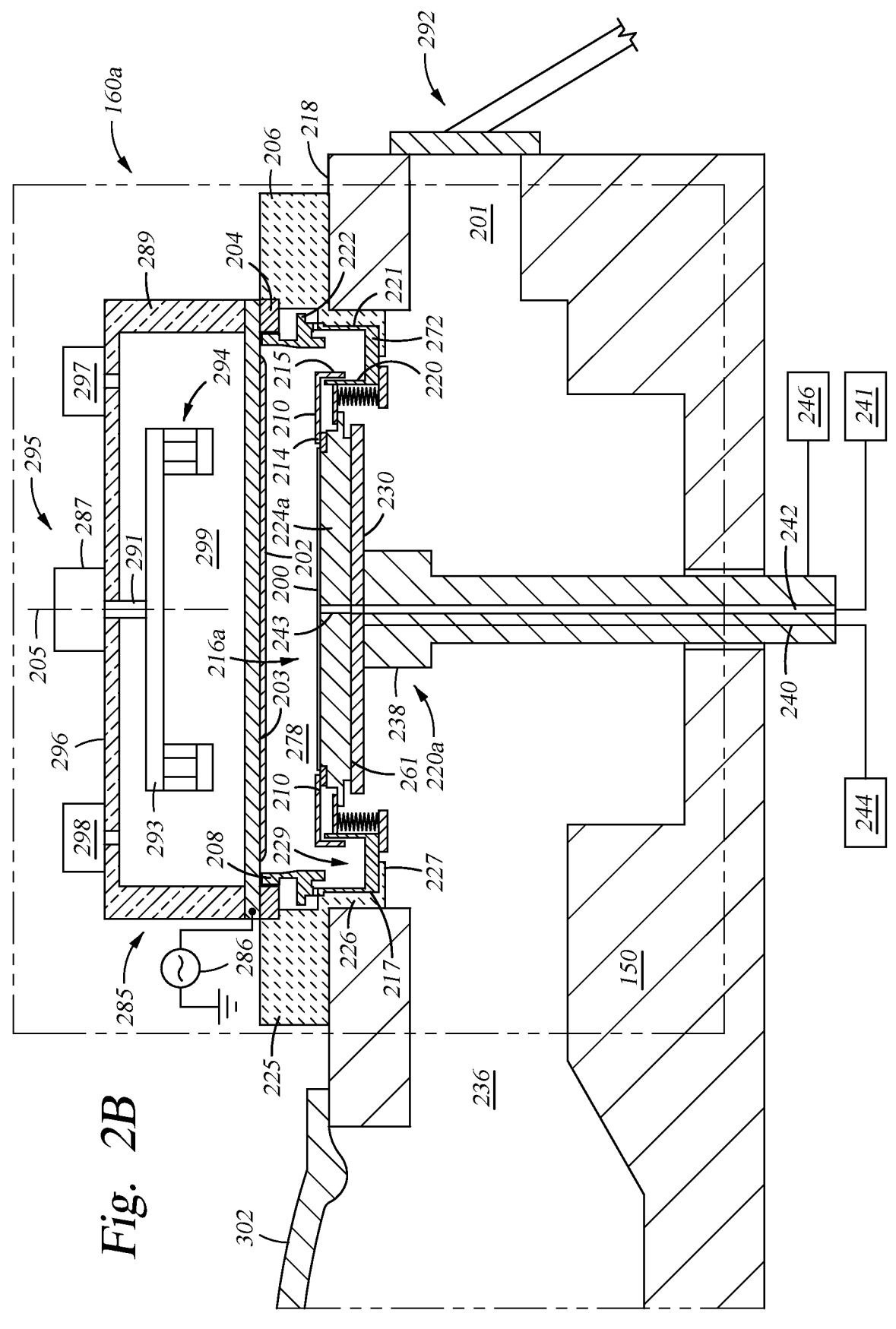

FIG. 2A-2B are schematic cross sectional views of a portion of a transfer chamber assembly 150 and a processing assembly 160a according to a first embodiment. In the first embodiment, the transfer chamber assembly 150 includes a robot, such as the central transfer device 145 (FIGS. 1A and 1B), to transfer a substrate 200 onto a substrate support surface 223 of a support chuck 224a within the processing assembly 160a. The support chuck 224a is attached to a substrate lift assembly 220a within the processing assembly 160a. The processing assembly 160a further includes a magnetron assembly 295 and a mini process chamber 216a.

FIG. 2A depicts the processing assembly 160a while the substrate lift assembly 220a is in a lowered, substrate receiving position in which the substrate 200 is positioned below the mini process chamber 216a. FIG. 2B depicts the processing assembly 160a while the substrate lift assembly is in a raised, substrate processing position in which the substrate 200 is positioned within the mini process chamber 216a. In the configuration shown in FIGS. 2A-2B, the support chuck 224a remains attached to the substrate lift assembly 220a both during transportation of the substrate 200 between the processing assemblies 160, and during substrate processing within the mini process chamber 216a.

The processing assembly 160a of FIG. 2A includes the magnetron assembly 295, a portion of a transfer chamber volume 236, a portion of the transfer chamber assembly 150, the mini process chamber 216a, the support chuck 224a, and the substrate lift assembly 220a. The processing assembly 160 of FIG. 2A shows the substrate lift assembly 220a in a substrate receiving position, such that the support chuck 224a and the substrate 200 are within the transfer chamber volume 236. An opening 201 and a plate and seal assembly 292 are disposed adjacent to the processing assembly 160a.

The opening 201 is on an outer sidewall of the transfer chamber assembly 150. The opening 201 is sized to allow a substrate 200 and a robot arm carrying the substrate 200 to pass therethrough. The robot arm may be the transfer robot 185 within the front end robot chambers 180 (FIG. 1A) or the buffer chamber transfer robots 148 of the buffer chamber 140 (FIG. 1B). The opening 201 is sealed from the front end robot chambers 180 and/or the buffer chamber 140 between movement of the substrates 200 to and from the transfer chamber assembly 150. The opening 201 is sealed using a plate and seal assembly 292 disposed on the outside of the opening 201. In embodiments in which the buffer chamber 140 is utilized, the opening 201 is adjacent to and aligned with the respective opening 146 of the buffer chamber 140.

A transfer chamber assembly lid 302 is disposed over the central transfer device 145 (FIGS. 1A-16). The transfer chamber assembly lid 302 is connected to the top surface of the transfer chamber assembly 150 and is able to be removed for maintenance and replacement of parts within the transfer chamber assembly 150.

In some embodiments, the mini process chamber 216a is a physical vapor deposition (PVD) process chamber, wherein a material to form a layer on a substrate 200 exposed therein is sputtered from a sputtering target assembly 203. Thus, the mini process chamber 216a herein includes the sputtering target assembly 203, a dielectric isolator 204, a liner 206, a containment member 208, a cover ring 210, the magnetron assembly 295, and a lid member 296. Contained within the mini process chamber 216a is a chamber volume 278.

The sputtering target assembly 203 is disposed on top of, and forms the enclosing cover of, the chamber volume 278. There, the sputtering target assembly 203 is circular as viewed from above and has a flat, i.e., generally planar, top surface. An annular surface of the sputtering target assembly 203 is disposed on the dielectric isolator 204, which is a dielectric material having sufficient dielectric strength and size to electrically isolate the sputtering target assembly 203 from the liner 206.

The sputtering target assembly 203 is connected to an AC power source 286. The AC power source 286 powers the sputtering target assembly 203, such that the sputtering target assembly 203 is biased during substrate processing.

The dielectric isolator 204 is annular in shape, such that the dielectric isolator 204 has a radial width and surrounds a hollow inner-radius portion. The dielectric material of the dielectric isolator 204 is any material capable of electrically isolating the sputtering target assembly 203 from the liner 206, and also provides thermal isolation therebetween. The liner 206 herein includes a portion which extends at least partially underneath the dielectric isolator 204 to form a support ledge on which the dielectric isolator 204 is physically supported. The liner 206 is in mechanical contact with at least a portion of a top surface 218 of the transfer chamber assembly 150. The liner 206 is also in contact with a portion of the containment member 208, which provides shielding between a flux of sputtered material from the sputtering target assembly 203 and an inner facing sidewall 217 of the of the liner 206.

The sputtering target assembly 203 is disposed between a magnetron volume 299, defined by magnetron support walls 289 and the lid member 296, and the chamber volume 278. An edge of a sputtering target 202 within the sputtering target assembly 203 is located inwardly of the containment member 208 and the dielectric isolator 204. The sputtering target 202 is composed of the material to be deposited on a surface of the substrate 200 during sputtering. The sputtering target 202 may be a copper sputtering target for depositing as a seed layer in high aspect ratio features formed in the substrate 200. The sputtering target 202 may also include other materials, such as a copper-doped aluminum sputtering target. Alternatively, the sputtering target 202 is composed of a liner/barrier material used to line the surfaces of a trench, via or contact opening in a dielectric layer, and the material deposited on the surfaces of a trench, via, or contact opening is composed of the target material, and in some cases a compound formed of the target material. For example, a tantalum layer with an overlying tantalum nitride layer thereon can be formed on the surfaces of a trench, via, or contact opening by first sputtering the target in an inert gas environment, and then adding nitrogen into the process volume. Alternatively, a first metal of a first target material is sputtered onto the substrate 200 including the surfaces of a trench, via, or contact opening thereon. The substrate 200 is moved to a second chamber having the same or different target composition, and a reactant such as nitrogen is introduced into the process volume to form the compound layer over the non-compound layer.

The liner 206 is an annular member. The liner 206 includes a main supporting portion 225 disposed on the top surface 218 of the transfer chamber assembly 150. The main supporting portion 225 includes an upper annular ledge on which the dielectric isolator 204 is disposed. The dielectric isolator 204 is physically supported by the main supporting portion 225 of the liner 206. The liner 206 includes a downwardly projected annular portion 226. The downwardly projected annular portion 226 is disposed downward from the main supporting portion 225 of the liner 206. The downwardly projected annular portion 226 is a vertical portion that extends from a bottom surface of the main supporting portion 225. A horizontal ringed portion 227 of the liner 206 is disposed on the distal bottom end of the downwardly projected annular portion 226. The horizontal ringed portion 227 extends radially inward from the downwardly projected annular portion 226 with respect to a processing assembly central axis 205. The horizontal ringed portion 227 is disposed underneath a lower annular portion 272 of the containment member 208. In the embodiment shown in FIGS. 2A-2B, the horizontal ringed portion 227 of the liner 206 is disposed underneath part of the lower annular portion 272 of the containment member 208. In some embodiments, the horizontal ringed portion 227 of the liner 206 may be disposed underneath the entirety of the lower annular portion 272 of the containment member 208.

The containment member 208 includes an upper shield body 222 and a lower shield body 229. The upper shield body 222 is a cylindrical body. The upper shield body 222 is disposed radially inwards of the main supporting portion 225 of the liner 206 with respect to the processing assembly central axis 205. The upper shield body 222 is disposed on top of the lower shield body 229. The lower shield body 229 is a U-shaped body.

The lower shield body 229 includes a first cylindrical lower portion 221, a second cylindrical lower portion 220, and a lower annular portion 272. The first cylindrical lower portion 221 is disposed radially outward of the upper shield body 222 with respect to the processing assembly central axis 205. The first cylindrical lower portion 221 connects to the bottom of the upper shield body 222. The first cylindrical lower portion 221 is a ring and extends vertically downwards from the first upper shield body 222. The lower annular portion 272 is connected to the distal end of the first cylindrical lower portion 221 furthest from the upper shield body 222. The lower annular portion 272 is a horizontal member that extends radially inwards from the first cylindrical lower portion 221. The lower annular portion 272 connects the first cylindrical lower portion 221 with the second cylindrical lower portion 220. The lower annular portion 272 is connected to the lower distal end of the second cylindrical lower portion 220. The second cylindrical lower portion 220 is a vertical cylindrical wall disposed above the lower annular portion 272. The second cylindrical lower portion 220 is disposed radially inward of the first cylindrical lower portion 221 and is concentric with at least a portion of the first cylindrical lower portion 221.

The cover ring 210 is disposed on top of the second cylindrical lower portion 220 of the lower shield body 229. The cover ring 210 prevents unwanted deposition on the edge ring 228 and the sides of the support chuck 224a or lift assembly 220a. The cover ring 210 includes a lower member 215 and an upper member 214. The upper member 214 has a horizontal contact surface 274. The horizontal contact surface 274 is sized to contact the edge ring 228 surrounding the support chuck 224a when the support chuck 224a and the lift assembly 220a are in a raised position as shown in FIG. 2B.

A bellows assembly 250 is disposed below the cover ring 210. The bellows assembly 250 is connected to the lower shield body 229 and disposed radially inwards of the liner 206 and the upper shield body 222 of the containment member 208 with respect to the processing assembly central axis 205.

The magnetron assembly 295 is disposed over the sputtering target assembly 203. The magnetron assembly 295 includes a plurality of magnets 294 supported by a base plate 293 connected to a shaft 291, which is axially aligned with the central axis 205 of the mini process chamber. The shaft 291 is connected to a motor 287 disposed on the opposite side of the lid member 296 of the magnetron assembly 295. The motor 287 spins the shaft 291 so that the magnets 294 rotate within the magnetron volume 299. The magnetron volume 299 is defined by the lid member 296, the magnetron support walls 289 and the sputtering target assembly 203. In one implementation, the magnets produce a magnetic field within the mini process chamber 216a near the front face of the sputtering target assembly 203 to maintain a plasma generated therein, such that a significant flux of ionized gas atoms strike the sputtering target assembly 203, causing sputter emissions of target material. The magnets are rotated about the central axis 205 of the mini process chamber to increase uniformity of the magnetic fields across the surface of the sputtering target assembly 203.

Fluid is delivered through the magnetron volume 299 in order to control the temperature of the magnets 294 and the sputtering target assembly 203. The fluid is delivered into the magnetron volume 299 by a fluid supply 297 and flown out of the magnetron volume by a fluid evacuator 298. The fluid supply 297 and the fluid evacuator 298 are on opposite sides of the magnetron assembly 295, such that fluid is flown through the magnetron volume 299, across the top of the sputtering target assembly 203, and over the magnets 294. The fluid may be DI water or other suitable cooling fluids.

The magnetron assembly 295, the AC power source 286, the sputtering target assembly, and the containment member 208 form a process component 285. The process component 285 may be selectively modified to perform different processes within the chamber volume 278. In some embodiments, the process component 285 may be modified to include a showerhead assembly, a remote plasma source, a plurality of heating elements, or sensors. In the embodiments described in FIGS. 2A-6E, the process component 285 is configured to enable a PVD process. In alternative embodiments, the process component 285 is modified so that the processing assemblies 160a, 160b are capable of performing CVD, ALD, etch, anneal, or cleaning processes.

The support chuck 224a and lift assembly 220a, collectively, include an edge ring 228, a stepped sealing ring 264, a lift assembly shaft 238, an upper lift section 230, an electrical line 240, a backside gas outlet 243, and a gas line 242. The substrate 200 is disposed on the substrate supporting surface 223 of the support chuck 224a.

The support chuck 224a supports the substrate 200 and the edge ring 228. In the embodiment shown, the support chuck 224a is an electrostatic chuck, such that the support chuck 224a can be biased by an electrical power source, such as the power source 244. The biasing of the support chuck 224a chucks the substrate 200 and holds the substrate 200 in place on the support chuck 224a during processing and movement of the lift assembly 220a. The support chuck 224a may also contain heating elements (not shown) and thermal sensors (not shown). The heating elements and temperature sensors may also be connected to the power source 244 and assist in maintaining a uniform and controlled temperature across the substrate supporting surface 223 and the substrate 200 disposed thereon.

The lift assembly 205a includes an actuator 246, such as one or more motors. The actuator 246 enables vertical and rotational movement of the support chuck 224a, such that the support chuck 224a can move vertically upwards and downwards through the transfer chamber volume 236 and rotationally about the central axis 205.

The support chuck 224a has a planar upper surface that forms the substrate supporting surface 223. The support chuck 224a has an outer ledge 266 disposed around the substrate supporting surface 223 of the support chuck 224a. The outer ledge 266 is vertically offset from the substrate supporting surface 223. The outer ledge 266 is sized to receive the edge ring 228. The edge ring 228 is disposed radially outward from the substrate supporting surface 223 of the support chuck 224a. The edge ring 228 is sized to contact the horizontal contact surface 274 of the cover ring 210 when the lift assembly 220a and the support chuck 224a are in the raised, processing position.

The support chuck 224a is disposed on top of the lift assembly 220a, such that the support chuck 224a is disposed on top of the upper lift section 230. The upper lift section 230 is disposed below an entire bottom surface 261 of the support chuck 224a. The upper lift section 230 is disposed on top of and surrounding the lift assembly shaft 238. The lift assembly shaft 238 is a vertical shaft. The lift assembly shaft 238 includes the electrical line 240 and the gas line 242 disposed therein. The electrical line 240 may include multiple electrical connections, such as wires. The electrical line 240 connects the support chuck 224a to the power source 244. The electrical line 240 and the power source 244 supply power to the support chuck 224a for biasing and heating. The power source 244 may also supply power for movement of the lift assembly 220a.

The gas line 242 is connected to a purge gas source 241. The gas line 242 is in fluid communication with the backside gas outlet 243. The purge gas supplied to the gas line 242 by the purge gas source 241 flows through the backside gas outlet 243 and provides backside gas to the bottom of the substrate 200 disposed on the substrate supporting surface 223.

The stepped sealing ring 264 is disposed radially outward of and connected to the support chuck 224a when taken with respect to the processing assembly central axis 205. The stepped sealing ring 264 is disposed below and has an overlapping annular surface area with the bellows assembly 250, such that the stepped sealing ring 264 contacts and forms a seal with the bellows assembly 250 when the support chuck 224a and the lift assembly 220a are raised to be in the processing position, as depicted in FIG. 2B.

In some embodiments, lift pins (not shown) may be disposed in lift pin holes formed through the support chuck 224a, the upper lift section 230 of the lift assembly 220a, and the main shield section 251 of the lower sealing shield

232 of the chuck sealing assembly 235. The lift pins may extend to the substrate supporting surface 223. The lift pins may be configured to lift and lower the substrate 200 between processing steps or when substrates are loaded or unloaded from the transfer chamber assembly 150. In some embodiments, other substrate transfer mechanisms are used in place of the lift pins. In this configuration, the lift pins are omitted to reduce leakage of process gas between the transfer chamber volume 236 and the chamber volume 278 during substrate processing.

FIG. 2B includes the same components as FIG. 2A. FIG. 2B illustrates the processing assembly 160a when the lift assembly 220a and the support chuck 224a are in an upper position or a processing position. When the lift assembly 220a is in the upper position, the stepped sealing ring 264 and the bellows assembly 250 contact one another and form a seal. Moving the lift assembly 220a to the upper position pushes the stepped sealing ring 264 upwards and in contact with a surface of the bellows assembly 250. The edge ring 228 is also moved upwards and contacts the horizontal contact surface 274 of the cover ring 210. The sealing surfaces of both the stepped sealing ring 264 and the bellows assembly 250 are parallel to the transfer plane of the substrate 200 through the transfer chamber volume 236 between the processing assemblies 160. The transfer plane of the substrate 200 is a horizontal plane parallel to the substrate support surface 223. The substrate 200 is transferred between the processing assemblies along the transfer plane by a robot disposed within the transfer chamber volume 236, such as the central transfer device 145.

The stepped sealing ring 264, the bellows assembly 250, the support chuck 224a, the containment member 208, and the sputtering target assembly 203 define the processing chamber volume 278 when the lift assembly 220a is lifted to the substrate processing position. While in the upper position, a process is performed on the substrate 200 within the chamber volume 278.

Figure 3A:
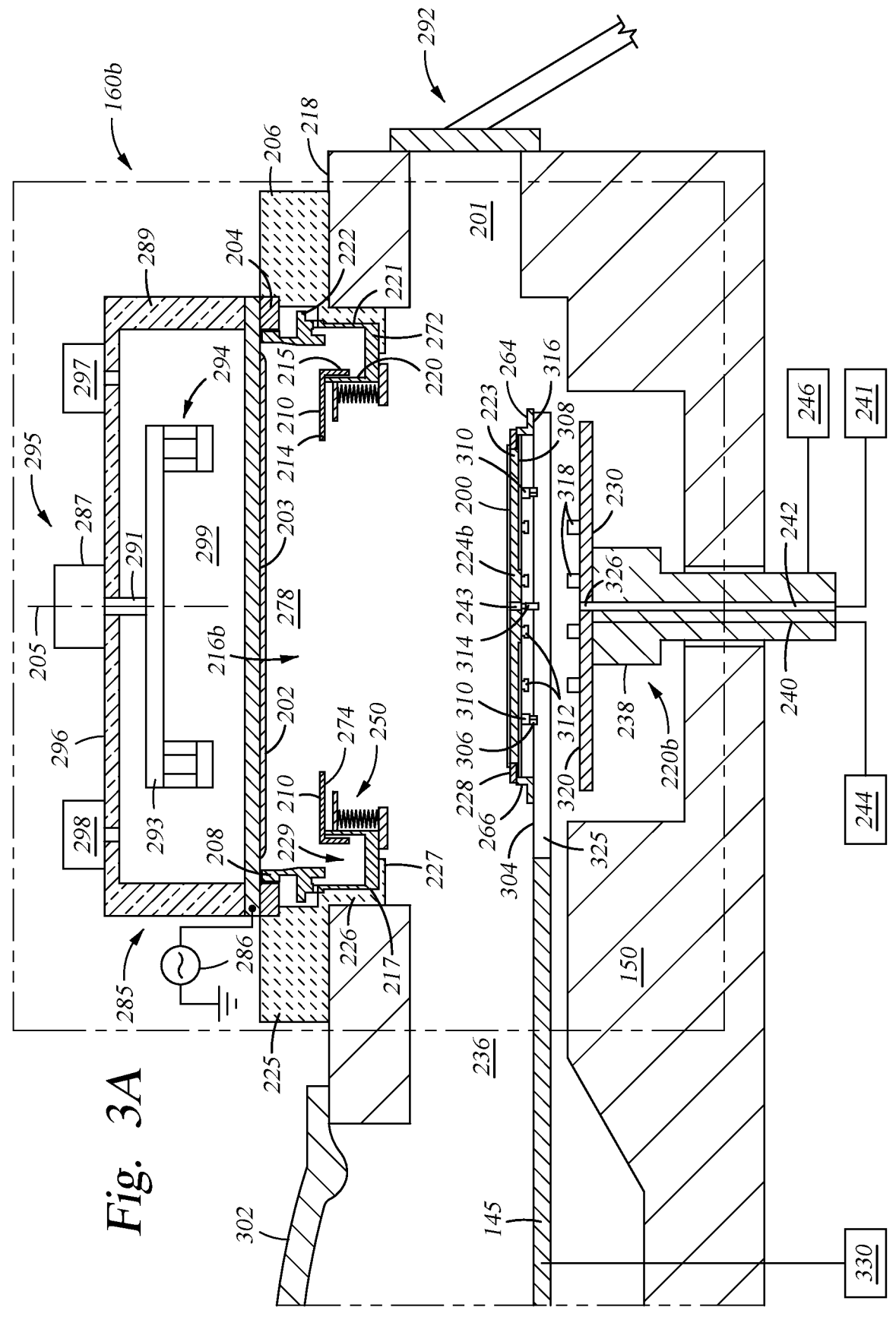
FIG. 3A-3B are schematic cross sectional views of a transfer chamber assembly and a processing assembly according to a second embodiment.
Figure 3B:
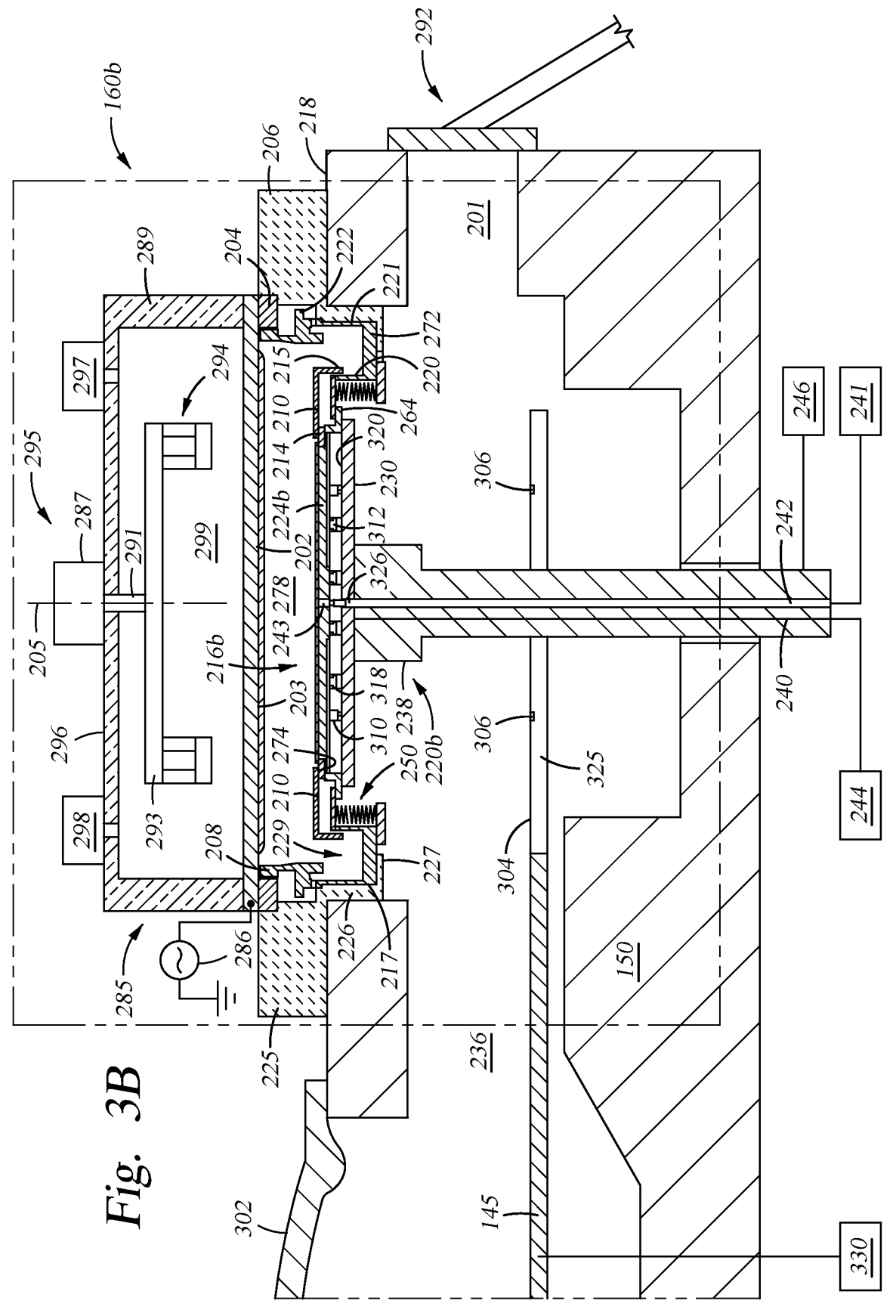

FIGS. 3A-3B are schematic cross sectional views of a portion of the transfer chamber assembly 150 and a processing assembly 160b according to a second embodiment. FIGS. 3A-3B depict the magnetron assembly 295, the AC power source 286, the opening 201, the plate and seal assembly 292, the transfer chamber volume 236, the transfer chamber assembly 150, a mini process chamber 216b, a support chuck 224b, and a substrate lift assembly 220b. The magnetron assembly 295, the AC power source 286, the plate and seal assembly 292, the transfer chamber volume 236, and the transfer chamber assembly 150 are similar to those depicted in FIGS. 2A-2B. The opening 201 is sized to allow the substrate 200, the support chuck 224b, or both the substrate 200 and the support chuck 224b to pass therethrough, such that the substrate 200 may be moved throughout the cluster tool 100a, 100b on the support chuck 224b.

The processing assembly 160b includes the mini process chamber 216b the magnetron assembly 295, a portion of a transfer chamber volume 236, a portion of the transfer chamber assembly 150, the support chuck 224b, and the substrate lift assembly 220b. The mini process chamber 216b of FIGS. 3A-3B includes the sputtering target assembly 203, the dielectric isolator 204, the liner 206, the containment member 208, the cover ring 210, the magnetron assembly 295, and the lid member 296. Inside of the mini process chamber 216b is the chamber volume 278. The sputtering target assembly 203, dielectric isolator 204, liner 206, containment member 208, cover ring 210, magnetron assembly 295, and lid member 296 are the same as those depicted in FIGS. 2A-2B.

The support chuck 224b, the central transfer device 145, and the substrate lift assembly 220b of the embodiment of FIGS. 3A-3B are different from the support chuck 224a, the central transfer device 145, and the substrate lift assembly 220a of the embodiment of FIGS. 2A-2B.

In FIG. 3A, the support chuck 224b and the lift assembly 220b are shown in a substrate receiving position. While in the substrate receiving position, the support chuck 224b and a substrate 200 disposed on the substrate supporting surface 223 of the support chuck 224b are separate from the lift assembly 220b and can be transported through the transfer chamber assembly 150 by the central transfer device 145 (FIGS. 1A-1B). The central transfer device 145 moves the substrate 200 and the support chuck 224b in an orbital path about the central axis 155 of the transfer chamber assembly 150 to transfer the substrate 200 positioned atop the support chuck 224b to the various processing assemblies 160.

Similar to the embodiment depicted in FIGS. 2A-2B, the lift assembly 220b has the support chuck 224b positioned over the upper lift section 230. The edge ring 228 is disposed on the support chuck 224b at a peripheral edge of the substrate 200. The stepped sealing ring 264 is positioned about the periphery of support chuck 224b. The lift assembly 220b includes the lift assembly shaft 238, the electrical line 240, the backside gas outlet 243, and the gas line 242. The substrate 200 is disposed on the substrate supporting surface 223 of the support chuck 224b.

The support chuck 224b is disposed on top of the lift assembly 220b. The support chuck 224b supports the substrate 200 and the edge ring 228. The support chuck 224b is an electrostatic chuck, such that the support chuck 224b can be biased by an electrical power source, such as the power source 244. The biasing of the support chuck 224b chucks the substrate 200 and holds the substrate 200 in place on the support chuck 224b during substrate processing operations and during movement of the lift assembly 220b. The support chuck 224b may also contain heating elements (not shown) and thermal sensors (not shown). The heating elements and temperature sensors may also be connected to the power source 244 and assist in maintaining a uniform and controlled temperature across the substrate supporting surface 223 and the substrate 200 disposed thereon.

The support chuck 224b is connected to the actuator 246, such as one or more motors. The actuator 246 enables vertical and rotational movement of the support chuck 224b, such that the support chuck 224b can move vertically upwards and downwards through the transfer chamber volume 236 and rotationally about the central axis 205.

The support chuck 224b has a planar upper surface that forms the substrate supporting surface 223. The support chuck 224b has the outer ledge 266 disposed around the substrate supporting surface 223 of the support chuck 224b. The outer ledge 266 is vertically offset from the substrate supporting surface 223. The outer ledge 266 is sized to receive the edge ring 228. The edge ring 228 is disposed radially outward from the substrate supporting surface 223 of the support chuck 224b. The edge ring 228 is sized to contact the horizontal contact surface 274 of the cover ring 210 when the support chuck 224b is in the raised, processing position.

The support chuck 224b further includes a lower surface 308. The lower surface 308 is opposite the substrate supporting surface 223 and is parallel to the substrate supporting surface 223. The lower surface 308 includes chuck transfer connections 310, chuck lift assembly connections 312, and a backside gas connection 314. The chuck transfer connections 310 are disposed on the lower surface 308 and serve as connection points between the support chuck 224b and transfer device connections 306 disposed on the central transfer device 145. The chuck transfer connections 310 serve to both electrically and physically connect the support chuck 224b to the central transfer device 145. The chuck transfer connections 310 provide power to the support chuck 224b while the support chuck 224b is disposed on the central transfer device 145. The chuck transfer connections 310 also serve to fasten the support chuck 224b to the central transfer device 145 during transfer within the transfer chamber assembly 150, such as from one processing assembly 160 to another processing assembly 160. In some embodiments, there are a plurality of chuck transfer connections 310, such as 2 to 5 chuck transfer connections 310.

The backside gas connection 314 is in fluid communication with the backside gas outlet 243. The backside gas connection 314 and the backside gas outlet 243 are centered in the support chuck 224b, such that the backside gas connection 314 and the backside gas outlet 243 are disposed through the center of the support chuck 224b. The backside gas connection 314 is connected to and disposed from the bottom side of the backside gas outlet 243, such that the backside gas connection 314 is disposed below the lower surface 308 of the support chuck 224b.

The central transfer device 145 includes a top surface 304, the transfer device connections 306, and a device opening 325. The central transfer device 145 transfers the substrate 200 and/or the support chuck 224 between the processing assemblies 160 within the transfer chamber volume 236. The central transfer device 145 travels in a horizontal transfer plane parallel to the top surface 304 of the central transfer device 145. The transfer device connections 306 are disposed on the top surface 304 of the central transfer device 145 and surrounding the device opening 325. The transfer device connections 306 are aligned with the chuck transfer connections 310 on the support chuck 224b. In some embodiments, there are a plurality of transfer device connections 306, such as 2 to 5 transfer device connections 306. The transfer device connections 306 are electrically connected to a transfer device power source 330. The transfer device power source 330 provides power for the chucking of the substrate 200 to the support chuck 224b during transportation of the support chuck 224b and the substrate 200 through the transfer chamber assembly 150. The chucking of the substrate 200 during transportation of the support chuck 224b holds the substrate 200 in place on the substrate supporting surface 223 and prevents backside damage to the substrate 200.

The backside gas connection 314 and the chuck lift assembly connections 312 are not connected to the central transfer device 145 and are disposed above the device opening 325 while the support chuck 224b is disposed on top of the central transfer device 145, such that the backside gas connection 314 and the chuck lift assembly connections 312 are disposed radially inward of the transfer device connections 306 with respect to the processing assembly central axis 205.

In FIG. 3B, the support chuck 224b is disposed on top of the lift assembly 220b, such that the support chuck 224b is disposed on top of the upper lift section 230. The upper lift section 230 is disposed on top of and surrounding the lift assembly shaft 238. The lift assembly shaft 238 is a vertical shaft. The lift assembly shaft 238 includes the electrical line 240 and the gas line 242 disposed therein. The electrical line 240 may include multiple electrical connections, such as wires. The electrical line 240 connects the support chuck 224b to the power source 244. The electrical line 240 and the power source 244 supply power to the support chuck 224*b* for biasing and heating. The power source 244 may also supply power to the actuator 246 for movement of the lift assembly 220*b*.

The gas line 242 is connected to a purge gas source 241. The gas line 242 is in fluid communication with the backside gas outlet 243 through the backside gas connection 314. The backside gas connection 314 connects to the lift assembly 220*b* through a gas connection receiver 326. The gas connection receiver 326 is disposed on a top surface 320 of the upper lift section 230. Once the backside gas connection 314 couples to the gas connection receiver 326, the purge gas source 241 is in fluid communication with the backside gas outlet 243. The purge gas supplied to the gas line 242 by the purge gas source 241 flows through the backside gas outlet 243 and provides backside gas to the bottom of the substrate 200 disposed on the substrate supporting surface 223.

The lift assembly 220*b* further includes chuck connections 318. The chuck connections 318 are disposed on the top surface 320 of the upper lift section 230 of the lift assembly 220*b*. The chuck connections 318 are electrically connected to the power source 244 by the electrical line 240. The chuck connections 318 supply power to the support chuck 224*b* when the support chuck 224*b* is connected to the lift assembly 220*b* by the chuck connections 318 and the lift assembly connections 312. The chuck connections 318 and the lift assembly connections 312 couple to one another when the lift assembly 220*b* is raised from the lower receiving position up to the central transfer device 145 and passes through the device opening 325 to contact the lift assembly connections 312. The support chuck 224*b* is then separated from the central transfer device 145 as the lift assembly 220*b* rises through the device opening 325 and moves to a processing position as shown in FIG. 3B.

The support chuck 224*b* is connected to the lift assembly 220*b* by the coupling of the lift assembly connections 312 and the chuck connections 318 as well as the backside gas connection 314 and the gas connection receiver 326. The lift assembly connections 312 and the backside gas connection 314 couple to the chuck connections 318 and the gas connection receiver 326 when the lift assembly 220*b* is raised so that the lift assembly connections contact the chuck connections 318 and the backside gas connection 314 contacts the gas connection receiver 326.

The stepped sealing ring 264 is disposed radially outward of and connected to the support chuck 224*b* with respect to the processing assembly central axis 205. The stepped sealing ring 264 is disposed below and has an overlapping annular surface area with the bellows assembly 250, such that the stepped sealing ring 264 contacts and forms a seal with the bellows assembly 250 when the support chuck 224*b* and the lift assembly 220*b* are raised to be in an upper processing position, such as in FIG. 3B. While the support chuck 224*b* is disposed on the central transfer device 145, the stepped sealing ring 264 contacts the top surface 316 of the central transfer device 145. In some embodiments, the stepped sealing ring 264 supports at least part of the weight of the support chuck 224*b* and supports the support chuck 224*b* during transportation of the support chuck 224*b* and the substrate 200 throughout the transfer chamber assembly 150 and while the lift assembly 220*b* is in the lower transfer position.

In some embodiments, lift pins (not shown) may be disposed in lift pin holes formed through the support chuck 224*b*, the upper lift section 230 of the lift assembly 220*b*, and the main shield section 251 of the lower sealing shield 232 of the chuck sealing assembly 235. The lift pins may extend to the substrate supporting surface 223. The lift pins are configured to lift and lower the substrate 200 between processing steps or when substrates are loaded or unloaded from the transfer chamber assembly 150. In some embodiments, other substrate transfer mechanisms are used in place of the lift pins. In this configuration, the lift pins are omitted to reduce leakage of process gas between the transfer chamber volume 236 and the chamber volume 278 during substrate processing. In embodiments such as those disclosed herein, the support chuck 224*a* as well as the substrate 200 are transferred in and out of the transfer chamber volume 236 using a robot with similar chucking capabilities as the central transfer device 145. In some embodiments, lift pins are formed to lift at least part of the support chuck 224*b* from the lift assembly 220*b* along with the substrate 200. The central transfer device 145 remains disposed in the processing assembly 160*b* during the processing of the substrate 200 in the chamber volume 278. In some embodiments, the central transfer device 145 is a carousel device and transports a plurality of substrates 200 between processing assemblies 160 of the transfer chamber assembly 150. The central transfer device 145 is configured to remain in a lower transfer position during the vertical movement of the lift assembly 220*b* and during substrate 200 processing, such that the central transfer device 145 remains still while the support chuck 224*b* and the substrate 200 are vertically transported to the processing position and during substrate processing.

The embodiments of FIG. 3A-3B allow for removal of the support chuck 224*b* from the substrate lift assembly 220*b*. The support chuck 224*b* is coupled to an arm of the central transfer device 245 during transportation of the substrate 200 and the support chuck 224*b* between processing assemblies 160. Coupling the support chuck 224*b* to the central transfer device 245 along with the substrate 200 decreases wear on the top surface of the support chuck 224*b* and enables the support chuck 224*b* to be utilized for a greater amount of time before replacement or maintenance of the support chuck 224*b*. By keeping the substrate 200 on the support chuck 224*b*, it has also been found that backside damages to the substrate 200 may be reduced as the substrate 200 is being lifted from and deposited onto the support chuck 224*b* at a lower frequency. The sealing surfaces of both the stepped sealing ring 264 and the bellows assembly 250 are parallel to the transfer plane of the substrate 200 through the transfer chamber volume 236 between the processing assemblies 160.

Figure 4A:
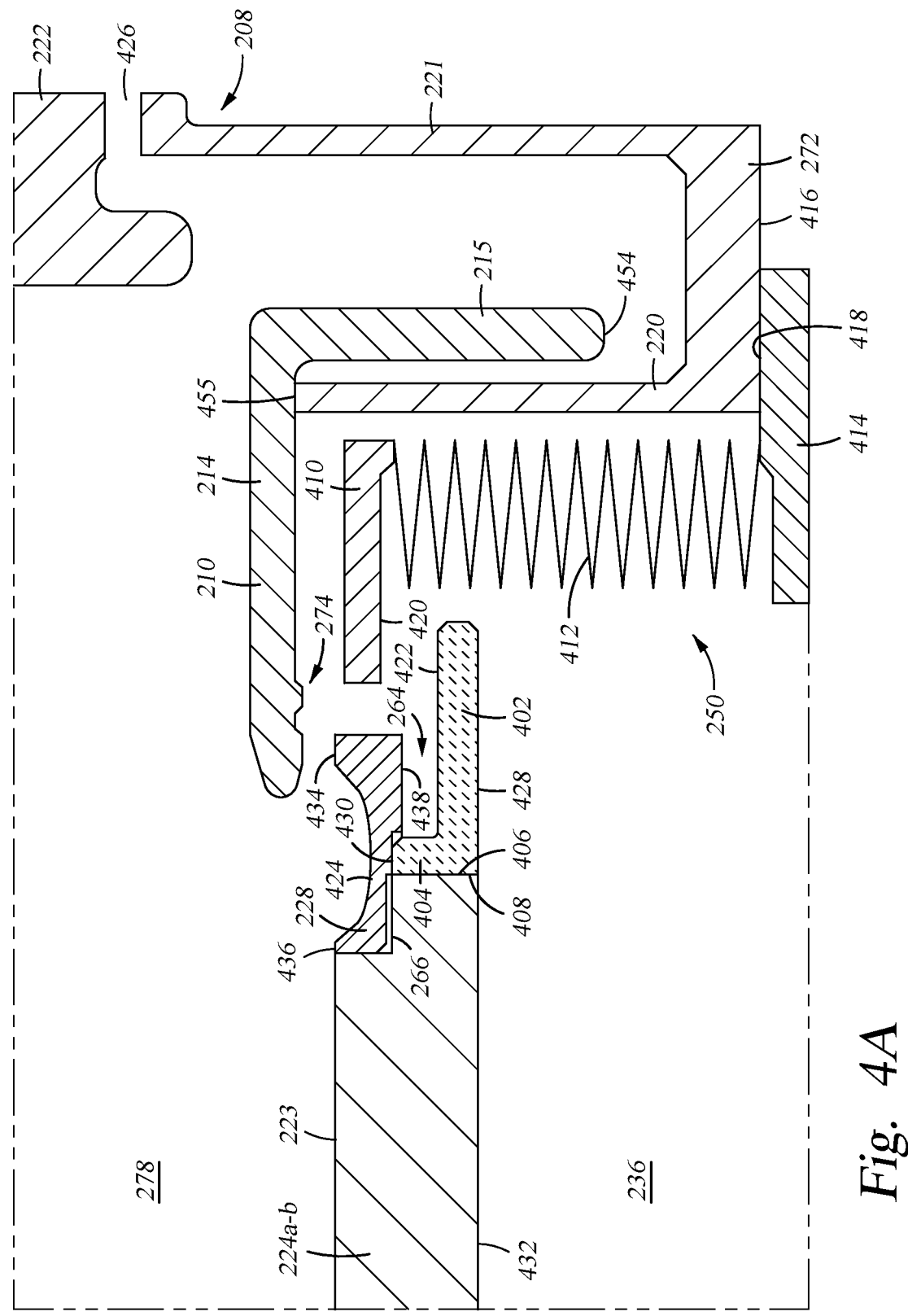
FIGS. 4A-4C are schematic close-up cross sectional views of the interface between the sealing ring and the bellows assembly according to FIGS. 2B and 3B.
Figure 4B:
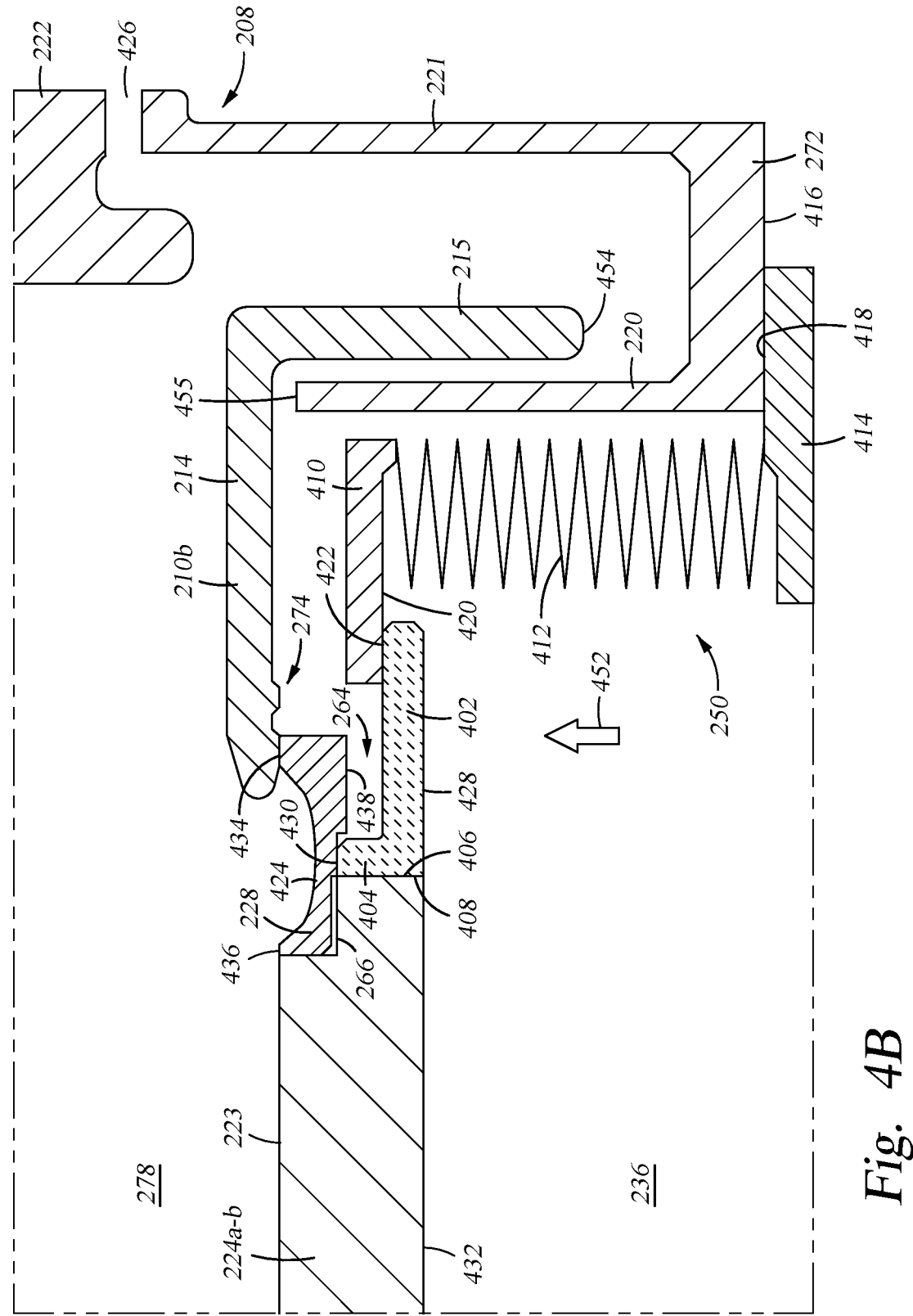
Figure 4C:
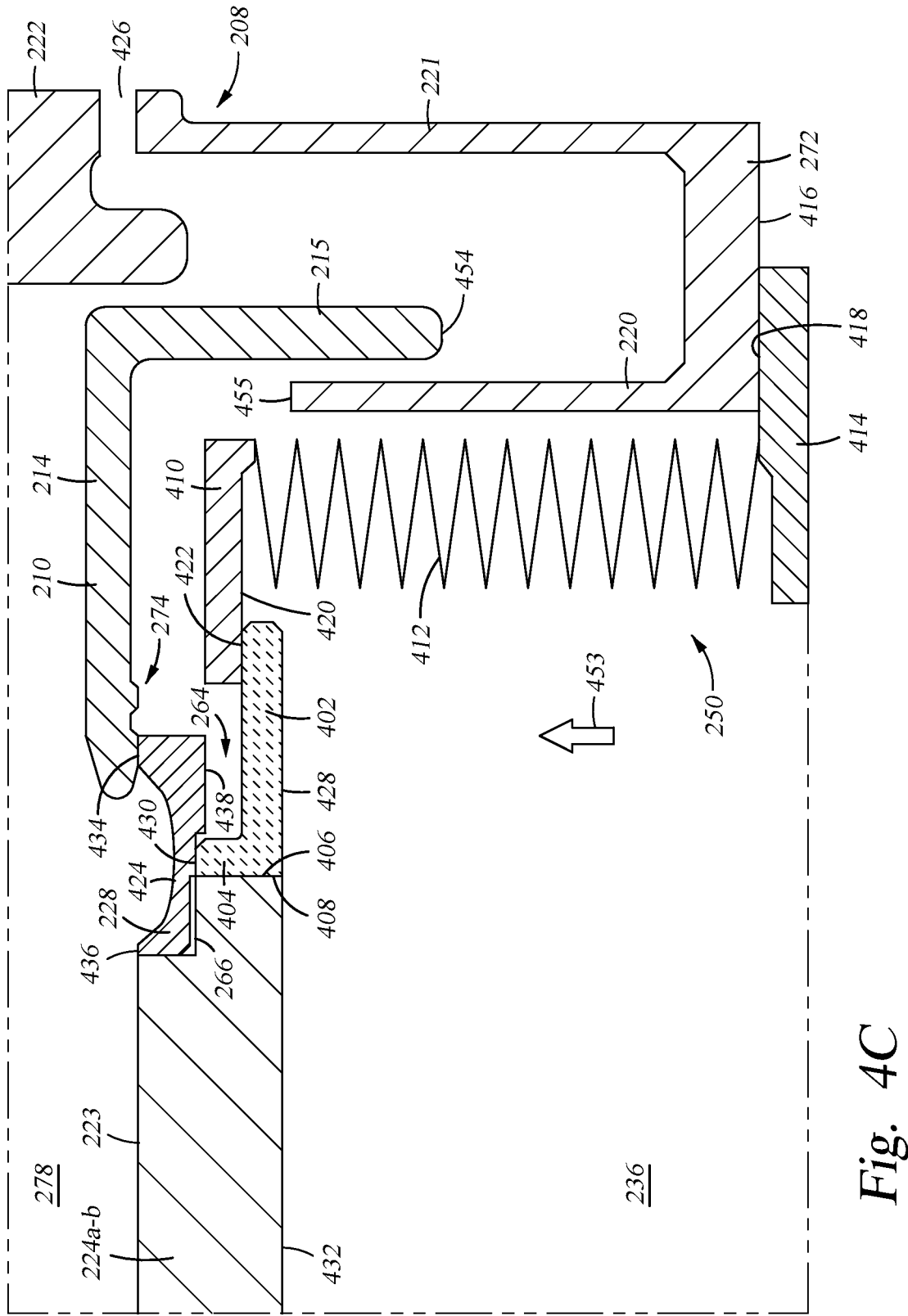

FIGS. 4A-4C are schematic close-up cross sectional views of the interface between the sealing ring 264 and the bellows assembly 250 according to FIGS. 2B and 3B. The interface between the edge ring 228 and the cover ring 210 is also shown. FIG. 4A shows the support chuck 224*a-b* in a first position. FIG. 4B shows the support chuck 224*a-b* in a second position. FIG. 4C shows the support chuck 224*a-b* in a third position.

In FIG. 4A, the first position of the support chuck 224*a-b* is a position below the processing position, such that the sealing ring 264 has not yet contacted the bellows assembly 250 and the bellows assembly 250 is not in a compressed or an expanded state.

The stepped sealing ring 264 includes an outer ledge portion 402 and a stepped portion 404. An inner radial wall 406 of the stepped sealing ring 264 is disposed adjacent to and in contact with an outer radial wall 408 of the support chuck 224*a-b*. The outer ledge portion 402 is a horizontal ledge extending radially outward from the stepped portion 404 of the stepped sealing ring 264. The stepped portion 404 extends vertically upward from a chuck sealing surface 422 of the outer ledge portion 402.

A bottom surface 428 of the stepped sealing ring 264 is the bottom surface of both the outer ledge portion 402 and the stepped portion 404. The bottom surface 428 is coplanar with the bottom chuck surface 432. The bottom chuck surface 432 may be the lower surface 308 of the support chuck 224b of FIGS. 3A-3B or the bottom surface 261 of the support chuck 224a of FIGS. 2A-2B.

A top surface 430 of the stepped sealing ring 264 is the top surface of the stepped portion 404. The top surface 430 is coplanar with the outer ledge 266 of the support chuck 224a-b. The edge ring 228 is partially disposed on the top surface 430 of the stepped sealing ring 264. The chuck sealing surface 422 is the top surface of the outer ledge portion 402. The chuck sealing surface 422 is a horizontal and planar surface. The chuck sealing surface 422 is vertically offset from the top surface 430 of the stepped sealing ring 264. The stepped sealing ring 264 may be a metal or a ceramic material, such that the surfaces of the stepped sealing ring 264 are a metal or ceramic material. When utilizing a metal material, the stepped sealing ring 264 may be an aluminum or anodized aluminum material, a stainless steel material, or an inconel alloy material. The stainless steel material may be 6000 series aluminum such as 6060 or 6061 aluminum. When utilizing a ceramic material, the ceramic material may be aluminum oxide, aluminum nitride, or quartz ($SiO_2$). The chuck sealing surface 422 has a surface roughness of less than or equal to about 10 Ra, such as about 2 Ra to about 10 Ra, such as about 4 Ra to about 8 Ra.

The edge ring 228 is disposed on top of the support chuck 224a-b and the stepped sealing ring 264, such that an edge ring bottom surface 438 is disposed on top of the top surface 430 of the stepped sealing ring and the outer ledge 266 of the support chuck 224a-b. The edge ring 228 includes an inner top surface 436, an intermediate top surface 424, and an outer top surface 434. The inner top surface 436 is disposed radially inward of both the intermediate top surface 424 and the outer top surface 434. The intermediate top surface 424 is disposed radially inward of the outer top surface 434. The intermediate top surface 424 is a curved top surface, such that the intermediate top surface 424 forms a groove between the inner top surface 436 and the outer top surface 434. The inner top surface 436 is coplanar with the outer top surface 434. The inner top surface 436 is coplanar with the substrate support surface 223. The outer top surface 434 is sized to receive the horizontal contact surface 274 of the upper member 214 of the cover ring 210.

The bellows assembly 250 includes an upper bellows ring 410, bellows 412, and a lower bellows ring 414. The bellows 412 is disposed between the upper bellows ring 410 and the lower bellows ring 414. The upper bellows ring 410 is disposed above the lower bellows ring 414. The upper bellows ring 410 is disposed radially inward of the second cylindrical lower portion 220 of the containment member 208.

The upper bellows ring 410 has an upper sealing surface 420 disposed on the bottom surface of the upper bellows ring 410. The upper sealing surface 420 is shaped to form an isolation seal with the chuck sealing surface 422 of the stepped sealing ring 264. The upper sealing surface 420 is parallel to the chuck sealing surface 422 of the stepped sealing ring 264 and the upper sealing surface 420 has an annular surface which overlaps at least part of the annular surface of the chuck sealing surface 422 of the stepped sealing ring 264. The upper bellows ring 410 may be a metal material, such that the surfaces of the upper bellows ring 410 are an aluminum, stainless steel, or inconel material. The aluminum may be an anodized aluminum. The stainless steel material may be a 6000 series stainless steel, such as 6060 or 6061 stainless steel. The upper sealing surface 420 has a surface roughness of less than or equal to about 10 Ra, such as about 2 Ra to about 10 Ra, such as about 4 Ra to about 8 Ra. Depending upon the stepped sealing ring 264, the upper sealing surface 420 and the chuck sealing surface 422 may have either similar or dissimilar materials, such that a seal is formed between either similar or dissimilar materials. Materials of the stepped sealing ring 264 and the chuck sealing surface 422 may be chosen in order to improve sealing between the upper sealing surface 420 and the chuck sealing surface 422 or to decrease the likelihood of deformation of the chuck sealing surface 422.

The chuck sealing surface 422 is parallel to the bottom surface of the sputtering target 202. As illustrated in FIGS. 2A-2B and 3A-3B, the substantially parallel orientation/alignment of the chuck sealing surface 422, the upper sealing surface 420, the substrate support surface 223, and the bottom surface of the sputtering target 202 allows a repeatable reliable seal to be formed while also allowing the angular alignment between the substrate support surface 223 and the bottom surface of the sputtering target 202 to be easily formed and/or maintained during processing. The chuck sealing surface 422 and the upper sealing surface 420 are also parallel to the transfer plane of the substrate and/or the support chuck 224b. The transfer plane is previously described and is the horizontal plane of transfer between the processing assemblies 160.

The lower bellows ring 414 is connected to the lower annular portion 272 of the containment member 208. The lower bellows ring 414 has an upper surface 418 which is disposed against a lower surface 416 of the lower annular portion 272 of the containment member 208. The upper surface 418 of the lower bellows ring 414 is coupled to the lower surface 416 of the lower annular portion 272 of the containment member 208.

The bellows 412 are disposed between the upper bellows ring 410 and the lower bellows ring 414, such that the bellows 412 are attached to the upper surface 418 of the lower bellows ring 414 and the upper sealing surface 420 of the upper bellows ring 410. The bellows 412 form a barrier between the upper bellows ring 410 and the lower bellows ring 414, such that gases cannot pass through the bellows 412. The bellows 412 have a spring constant (k) of about 50 lbf/in to about 80 lbf/in, such as about 55 lbf/in to about 75 lbf/in, such as about 60 lbf/in to about 70 lbf/in. As discussed below, in some embodiments, the spring rate of the bellows 412 is selected to achieve a desired sealing force to be achieved within a desired range of extensions of the bellows 412. In some embodiments, the spring constant (k) of the bellows 412 varies depending upon the temperature of the processes performed within the chamber volume 278. The bellows 412 change in temperature along with the temperature within the chamber volume 278. In some embodiments, when the operating temperature within the chamber volume 278 is at a temperature of about 350 degrees C. to about 600 degrees C. the spring constant of the bellows 412 is about 55 lbf/in to about 75 lbf/in, such as about 60 lbf/in to about 70 lbf/in. In other embodiments, when the chamber volume 278 is at an operating temperature of about 150 degrees C. to about 250 degrees C., the spring constant of the bellows 412 is about 35 lbf/in to about 55 lbf/in, such as about 40 lbf/in to about 50 lbf/in. In yet other embodiments, when the operating temperature within the chamber volume 278 is about 20 degrees C. to about 150 degrees C., the spring constant of the bellows 412 is about 15 lbf/in to about 35 lbf/in, such as about 20 lbf/in to about 30 lbf/in. The change in spring constant of the bellows 412 over the variety of temperature ranges is due to the change in the young's modulus of the material. The bellows 412 may also thermally expand or contract.

The bellows 412 of the bellows assembly 250 is configured to be compliant in at least one direction, such as the vertical direction (i.e., Z-direction), and is configured to prevent gas from passing therethrough during processing. The bellows assembly 250 may be a stainless steel or Inconel bellows assembly that is welded at opposing ends to the upper bellows ring 410 and the lower bellows ring 414. The compliant nature of the bellows assembly 250 allows any misalignment or planarity differences between the chuck sealing surface 422 of the stepped sealing ring 264 and the upper sealing surface 420 of the process chamber wall to be taken up so that a reliable and repeatable seal can be formed at the upper sealing surface 420. In the embodiment of FIGS. 2-5, the bellows assembly 250 is an expansion bellows assembly and the bellows 412 expand during sealing of the process chamber volume 278.

While in the first position of FIG. 4A, the stepped sealing ring 264 does not impart any force on the upper sealing surface 420. Without any force between the stepped sealing ring 264 and the upper sealing surface 420, there is no seal between the chamber volume 278 and the transfer chamber volume 236. In the first position of FIG. 4A, the chamber volume 278 and the transfer chamber volume 236 are in fluid communication. When the chamber volume 278 and the transfer chamber volume 236 are in fluid communication, gases provided through a process gas inlet 426 may leak into the transfer chamber volume 236.

In the first position of FIG. 4A, the bellows 412 are at a length of about 1.1 inches to about 1.7 inches, such as about 1.2 inches to about 1.6 inches, such as about 1.3 inches to about 1.5 inches. The bellows 412 are in a relaxed state and do not have any forces from the support chuck 224a-b impacting the length of the bellows.

In FIG. 4B, the support chuck 224a-b is in a second position, such that the stepped sealing ring 264 has contacted the upper sealing surface 420 of the upper bellows ring 410. The second position is a vertical position between the first position of FIG. 4A and the third position of FIG. 4C.

In addition to the stepped sealing ring 264 contacting the upper sealing surface 420 of the upper bellows ring 410, the outer top surface 434 of the edge ring 228 is disposed against the horizontal contact surface 274 of the cover ring 210. The cover ring 210 protects the bellows assembly 250 from process radicals within the chamber volume 278. When the cover ring 210 contacts the edge ring 228, the protection of the bellows assembly is improved.

When the support chuck 224a-b is raised to the second position, the upper bellows ring 410 is pushed upwards and the bellows 412 expand. The edge ring 228 contacting the cover ring 210 also pushes the cover ring 210 upwards. When the cover ring 210 is raised, a bottom surface 454 of the lower member 215 of the cover ring 210 is vertically below a top surface 455 of the second cylindrical lower portion 220 of the containment member 208. The bottom surface 454 of the lower member 215 being vertically below the top surface 455 of the second cylindrical lower portion 220 of the containment member 208 ensures that the bellows 412 of the bellows assembly 250 are protected from process radicals.

In the second position of FIG. 4B, the bellows 412 are expanded to a length of about 1.2 inches to about 1.8 inches, such as about 1.3 inches to about 1.7 inches, such as about 1.4 inches to about 1.6 inches.

The stepped sealing ring 264 being in contact with the upper sealing surface 420 of the upper bellows ring 410 causes a low force 452 to be imparted by the stepped sealing ring 264 on the upper sealing surface 420. The low force 452 provides at least a partial seal between the chamber volume 278 and the transfer chamber volume 236. The seal between the chamber volume 278 and the transfer chamber volume 236 allows for some processes to be performed which do not require pressures different from the pressure within the transfer chamber volume 236. In addition, the purging of the chamber volume 278 may begin while the support chuck 224a-b is lifted to a final processing position.

FIG. 4C shows the support chuck 224a-b in a third position higher than the second position, such that the stepped sealing ring 264 has contacted the upper sealing surface 420 of the upper bellows ring 410 and the support chuck 224a-b proceeded to move upwards to expand the bellows 412. The third position is a vertical position above both the first position of FIG. 4A and the second position of FIG. 4B.

In addition to the stepped sealing ring 264 contacting the upper sealing surface 420 of the upper bellows ring 410, the outer top surface 434 of the edge ring 228 is disposed against the horizontal contact surface 274 of the cover ring 210.

When the support chuck 224a-b is raised to the third position, the upper bellows ring 410 is push upwards and the bellows 412 expand to a greater expansion point than in the second position. The edge ring 228 contacting the cover ring 210 also pushes the cover ring 210 upwards. When the cover ring 210 is raised, the bottom surface 454 of the lower member 215 of the cover ring 210 is still vertically below the top surface 455 of the second cylindrical lower portion 220 of the containment member 208.

In the third position of FIG. 4C, the bellows 412 are expanded to a length of about 1.7 inches to about 2.3 inches, such as about 1.8 inches to about 2.2 inches, such as about 1.9 inches to about 2.1 inches. The total stroke of the bellows 412 from the first position of FIG. 4A to the third position of FIG. 4C is about 0.5 inches to about 1.1 inches, such as about 0.6 inches to about 1.0 inches, such as about 0.7 inches to about 0.9 inches.

The stepped sealing ring 264 being in contact with the upper sealing surface 420 of the upper bellows ring 410 and the bellows 412 being further expanded causes a high force 453 to be imparted by the stepped sealing ring 264 on the upper sealing surface 420. The high force 453 is greater than the low force 452 at the second position in FIG. 4B. The high force 453 provides a full seal between the chamber volume 278 and the transfer chamber volume 236, such that the chamber volume 278 and the transfer chamber volume 236 are fluidly isolated. The seal between the chamber volume 278 and the transfer chamber volume 236 allows for processes to be performed which require pressures different from the pressure within the transfer chamber volume 236. Moreover, due to the overall design(s) disclosed herein the spacing between the surface of a substrate disposed on the substrate support surface 223 and surface of a target can be adjusted to improve the process results achieved during a substrate processing step (e.g., PVD deposition step). In some embodiments, the spring rate of the bellows 412 is selected to achieve a desired high force 453 when the substrate is positioned within a desired range of target to substrate spacings.

The structural integrity of both the chuck sealing surface 422 and the upper sealing surface 420 is maintained after the processing of a large quantity of substrates within the processing assembly 160. The chuck sealing surface 422 and the upper sealing surface 420 have little warpage over time and therefore maintain a high quality seal between the chamber volume 278 and the transfer chamber volume 236 throughout the lifetime of the chamber. Warpage may be either a bowing of one of the chuck sealing surface 422 of the upper sealing surface 420 or may be an undesired abrasion of the chuck sealing surface 422 and the upper sealing surface 420. Undesired bowing or abrasions would create leaks within the seal formed between the chuck sealing surface 422 and the upper sealing surface 420. Warpage of the chuck sealing surface 422 and the upper sealing surface 420 is minimized at least in part by the utilization of the bellows assembly 250. The bellows assembly 250 minimizes abrupt applications of force to either of the chuck sealing surface 422 and the upper sealing surface 420. The bellows assembly 250 disperses the impact force of forming a seal over a larger amount of time and therefore reduces deformation of the chuck sealing surface 422 and the upper sealing surface 420.

The sealing ring 264 and the chuck sealing surface 422 maintain planarity over wide ranges of temperatures and pressures within both the transfer chamber volume 236 and the chamber volume 278. The sealing ring 264 additionally maintains planarity during a wide range of positions of the support chuck 224a-b. In embodiments in which the support chuck 224a-b is moved during substrate processing, the flexibility of the bellows 412 allows for both the chuck sealing surface 422 of the sealing ring 264 and the upper sealing surface 420 to remain planar and parallel to one another over a range of support chuck 224a-b positions. The support chuck 224a-b may be moved if a substrate is desired to be moved during processing. The sealing ring 264 and the chuck sealing surface 422 further maintain planarity as the temperature of the substrate 200 and the substrate support surface 223 are increased during substrate processing. As the position of the chuck sealing surface 422 varies due to thermal expansion and contraction, the bellows assembly 250 passively adjusts position to accommodate the movement and maintain the seal.

The upper bellows ring 410 is considered a process chamber wall. The process chamber walls may be any wall defining the chamber volume in the processing assembly 160. In some embodiments, additional process chamber walls include the sputtering target assembly 203, the containment member 208, and the bellows 412.

Figure 5:
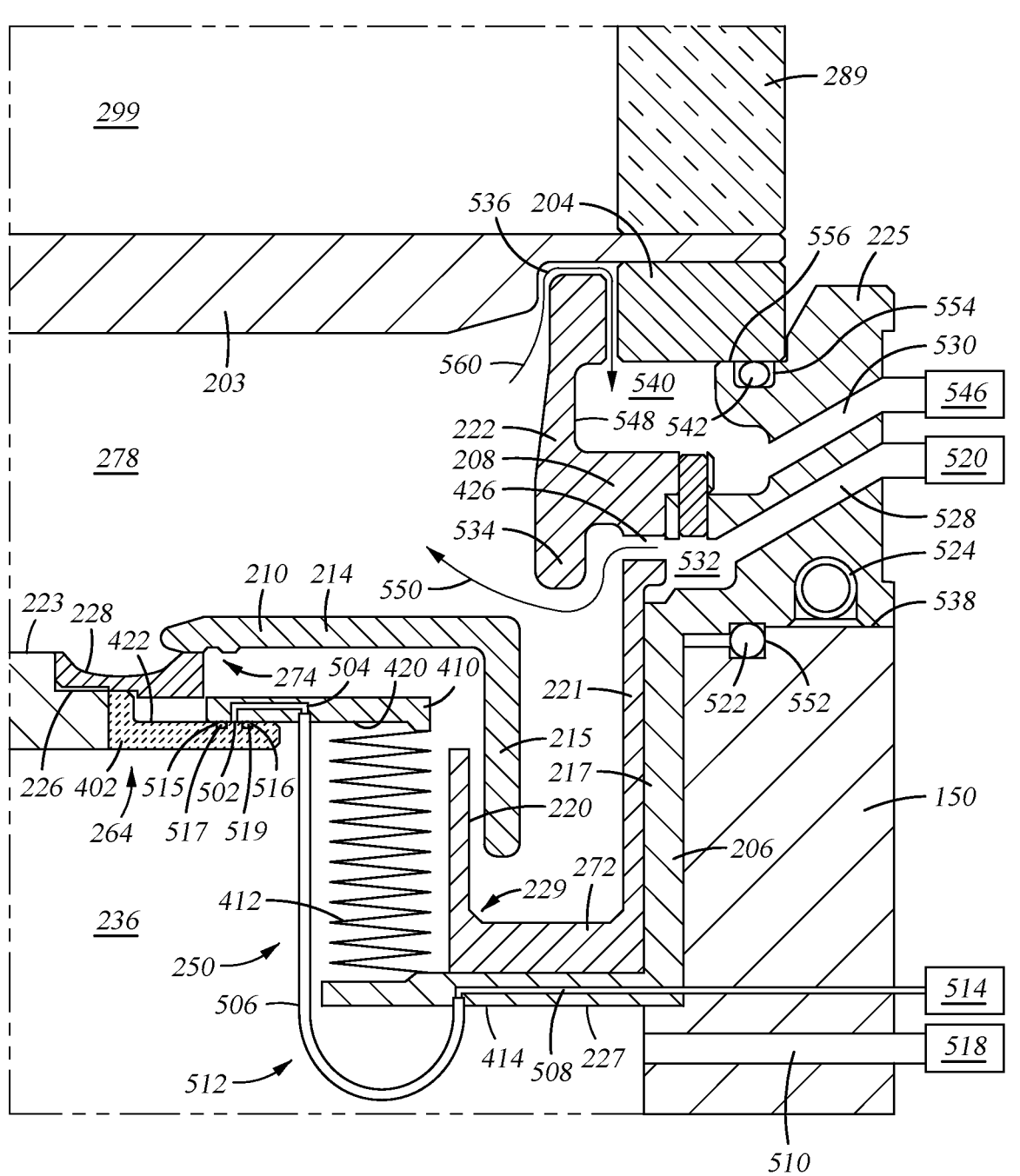
FIG. 5 is a schematic close-up cross section view of a modified interface between the sealing ring and the bellows assembly as well as the gas inlet and outlet according to FIGS. 2B and 3B.

FIG. 5 is a schematic close-up cross section view of a modified interface between the sealing ring 264 and the bellows assembly 250 as well as the gas inlet 426 and a gas outlet 536 according to FIGS. 2B and 3B. The interface between the sealing ring 264 and the bellows assembly 250 includes an intermediate pumped region 502. The gas inlet 426 and the gas outlet 536 are disposed through the containment member 208.

The intermediate pumped region 502 is disposed between the chuck sealing surface 422 of the sealing ring 264 and the upper sealing surface 420 of the upper bellows ring 410 of the bellows assembly 250. The intermediate pumped region 502 may be a small cavity or pocket formed between the chuck sealing surface 422 and the upper sealing surface 420. The intermediate pumped region 502 is formed at the end of a pumping line 512. The pumping line 512 is disposed through the upper bellows ring 410, the lower bellows ring 414, the horizontal ringed portion 227 of the liner 206, and a sidewall of the transfer chamber assembly 150. The pumping line 512 is connected to an intermediate region pump 514. The intermediate region pump 514 may be used to pump the intermediate pumped region 502 to a pressure between the pressures of the chamber volume 278 and the transfer chamber volume 236.

The pumping line 512 includes a first pump line section 504, a second pump line section 506, and a third pump line section 508. The first pump line section 504, the second pump line section 506, and the third pump line section 508 are all connected and in fluid communication with one another, such that the first pump line section 504 is connected to, and in fluid communication with, the second pump line section 506 and the second pump line section 506 is connected to, and in fluid communication with, the third pump line section 508. The third pump line section 508 is connected to, and in fluid communication with, the intermediate region pump 514.

The first pump line section 504 is disposed through the upper bellows ring 410, such that the first pump line section 504 has a first end adjacent to the intermediate pumped region 502 and formed through part of the upper sealing surface 420 and a second end formed through the upper sealing surface 420 radially outward of the outer ledge portion 402 of the sealing ring 264 and radially inwards of the bellows 412. The second end of the first pump line section 504 connects to a first end of the second pump line section 506.

The second pump line section 506 is disposed radially inwards of the bellows 412 of the bellows assembly 250. The second pump line section 506 extends from the upper bellows ring 410 to the lower bellows ring 414. The second end of the second pump line section 506 connects to a first end of the third pump line section 508 at an outer wall of the lower bellows ring 414.

The third pump line section 508 is formed through the lower bellows ring 414, the horizontal ringed portion 227 of the liner 206 and the sidewall of the transfer chamber assembly 150. The third pump line section 508 is a horizontally disposed pump line. The second end of the third pump line section 508 is connected to the intermediate region pump 514. Alternatively, there may be an additional fourth pump line section, which connects the third pump line section 508 to the intermediate region pump 514. In some embodiments, the intermediate region pump 514 is a vacuum pump.

The magnetron assembly 295 is disposed on the sputtering target assembly 203, such that the magnetron support walls 289 are disposed on top of the sputtering target assembly 203 and above the dielectric isolator 204. The magnetron volume 299 is fluidly isolated from the chamber volume 236 and the transfer chamber volume 236. The sputtering target assembly 203 separates the magnetron volume 299 from the chamber volume 236.

The chuck sealing surface 422 further includes two o-ring grooves 515, 516 and two o-rings 517, 519. The first o-ring groove 515 and the second o-ring groove 516 are disposed in the chuck sealing surface 422 of the stepped sealing ring 264. The o-ring grooves 515, 516 may be disposed such that the first o-ring groove 515 is radially inward of the intermediate pumped region and the second o-ring groove is radially outward of the intermediate pumped region. A first o-ring 517 and a second o-ring 519 are disposed in the first o-ring groove 515 and the second o-ring groove 516, respectively. The first o-ring 517 and the second o-ring 519 may be KYFLON™ o-rings. The first o-ring 517 and the second o-ring 519 seal against the upper sealing surface 420 of the upper bellows ring 410. The first and second o-rings 517, 519 assist in forming the isolation seal between the transfer chamber volume 236 and the chamber volume 278.

The transfer chamber volume 236 forms a lower pumped region. The transfer volume pump 518 pumps the transfer chamber volume 236 to a predetermined pressure. A transfer volume pump 518 is fluidly connected to the transfer chamber volume 236 by a transfer volume line 510. The transfer volume line 510 is formed through the sidewall of the transfer chamber assembly 150. In some embodiments, the transfer volume pump 518 is a vacuum pump.

The gas inlet 426 and the gas outlet 536 are in fluid communication with the chamber volume 278. The gas inlet 426 is formed between the upper shield body 222 and the first cylindrical lower portion 221 of the lower shield body 229. The gas inlet 426 may alternatively be formed through one of either the first cylindrical lower portion 221 of the lower shield body 229 or the upper shield body 222. The gas inlet 426 fluidly connects the chamber volume 278 to an inlet plenum 532. The inlet plenum 532 is a plenum which surrounds the chamber volume 278 and is formed through the main supporting portion 225 of the liner 206. The inlet plenum 532 is at least partially defined by the main supporting portion 225 of the liner 206 and an outer surface of the containment member 208. The inlet plenum 532 is fluidly connected to an inlet gas passage 528. The inlet gas passage 528 fluidly connects the inlet plenum 532 with a gas source 520. The inlet gas passage 528 is a sloped gas passage, in which the inlet gas passage 528 has a negative slope as the inlet gas passage 528 approaches the inlet plenum 532 from the gas source 520.

The gas source 520 may supply process gases, purge gases, conditioning gases, or cleaning gases. The gas source 520 may be multiple gas sources 520 in some embodiments. The gas source 520 may supply gases such as silicon containing gases, nitrogen containing gases, and oxygen containing gases. The gas source 520 may also supply argon, neon, and helium gases. When a cleaning gas is being supplied, the gas source 520 may supply a chlorine or a fluorine gas. Other process gases, purge gases, conditioning gases, or cleaning gases may be supplied that are not explicitly described herein.

The gas outlet 536 is formed between the upper shield body 222, the sputtering target assembly 203, and the dielectric isolator 204. The gas outlet 536 connects the chamber volume 278 with an exhaust plenum 540. The exhaust plenum 540 circumscribes the chamber volume 278 and at least part of the upper shield body 222 of the containment member 208. The exhaust plenum 540 is formed through the main supporting portion 225 of the liner 206. The exhaust plenum 540 is at least partially defined by an outer wall 548 of the upper shield body 222 of the containment member 208, the dielectric isolator 204, and the main supporting member 208 of the liner 206. The exhaust plenum 540 fluidly connects the gas outlet 536 to an outlet gas passage 530. The outlet gas passage 530 is formed through the main supporting portion 225 of the liner 206. The outlet gas passage 530 fluidly connects the exhaust plenum 540 and the exhaust pump 546.

The exhaust pump 546 functions to exhaust gases introduced into the chamber volume 278 by the gas source 520. The exhaust pump 546 also functions to pump the chamber volume 278 to pre-determined process pressures. In some embodiments, the lift assembly 220a-b is lifted to the processing position and the chamber volume 278 is fluidly isolated from the transfer chamber volume 236. The pressure within the chamber volume 278 and the transfer chamber volume 236 directly after moving the lift assembly 220a-b to the processing position is the same pressure. In some embodiments, processes are performed at pressures different from the pressure within the transfer chamber volume 236. To change the pressure within the chamber volume 278, the exhaust pump 546 may pump out gas from the chamber volume 278 or gases may be introduced by the gas source 520.

The flow of gases through the process gas inlet 426 is shown by inlet flow arrows 550. The inlet flow arrows 550 show the gases moving from the process gas inlet 426 down between an overhang 534 of the upper shield body 222 and the first cylindrical lower portion 221 of the lower shield body 229. The inlet flow arrows 550 then show the gases flowing between the cover ring 210 and the overhang 534 of the upper shield body 222 to enter the main portion of the chamber volume 278. The cover ring 210 shields the bellows assembly 250 from the direct introduction of the gases from the process gas inlet 426 and directs the gases upwards towards the center of the chamber volume 278.

The flow of gases from the chamber volume 278 through the gas outlet 536 is shown by exhaust flow arrows 560. The exhaust flow arrows 560 show the exhaust gases moving from the chamber volume 278 to the gas outlet 536 at the top corner of the chamber volume 278. The exhaust flow arrows 560 then show the exhaust gases flowing from the gas outlet 536 to the exhaust plenum 540.

The main supporting portion 225 of the liner 206 has a cooling channel 524 disposed therein. The cooling channel 524 is disposed between the main supporting portion 225 of the liner 206 and a top surface 538 of the transfer chamber assembly 150. The cooling channel 524 may have water or other fluids circulated therein to maintain a constant temperature within the liner 206 or the transfer chamber assembly 150 during substrate processing.

An o-ring 522 is disposed in a groove 552 on the top surface 538 of the transfer chamber assembly 150. The o-ring 522 is between the top surface 538 of the transfer chamber assembly 150 and the main supporting portion 225 of the liner 206.

An o-ring 542 is disposed in a groove 554 on a support ledge 556 of the main supporting portion 225 of the liner 206. The o-ring 542 is disposed between the main supporting portion 225 of the liner 206 and the dielectric isolator 204.

FIGS. 6A-6E are schematic close-up cross sectional views of interfaces between modified edge rings 628a-e, alternate cover rings 611a-e, the lower shield body 229, and a compressive bellows assembly 650 according to FIGS. 2B and 3B. Each of the alternative interfaces of FIGS. 6A-6E may be combined with one another or combined with the embodiments of FIGS. 2B and 3B. The embodiments of FIGS. 6A-6E are embodiments in which the bellows assembly 250 are replaced with a compressive bellows assembly 650, the edge ring 228 is replaced by one of several modified edge rings 628a-e, and the cover ring 210 is replaced by one of several modified cover rings 611a-e. In some embodiments, the lower shield body 229 is replaced the modified lower shield body 629.

Figure 6A:
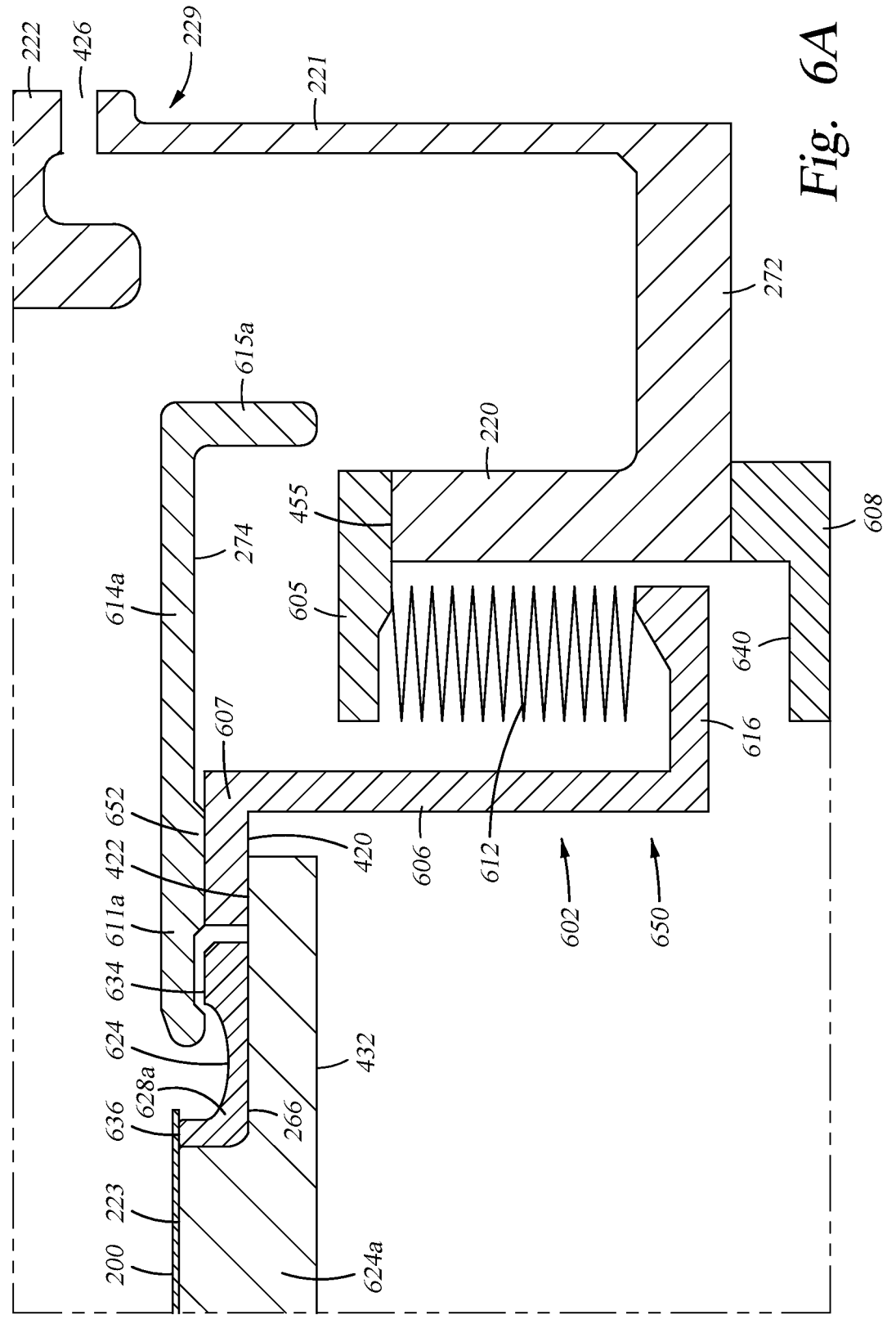
FIGS. 6A-6E are schematic close-up cross sectional views of alternate interfaces between the sealing ring and the bellows assembly according to FIGS. 2B and 3B.

In FIG. 6A, a first alternative embodiment is depicted. The first alternative embodiment has a lower shield body 229 similar to the lower shield body 229 described in FIGS. 1-5. The lower shield body 229 has a compressive bellows assembly 650 and a bellows stopper 608 attached thereon. The first alternative embodiment also includes a modified cover ring 611a, a modified edge ring 628a, and a modified support chuck 624a. The modified cover ring 611a, the modified edge ring 628a, and the modified support chuck 624a have similar material compositions to the cover ring 210, the edge ring 228, and the support chuck 224 described herein, but include modified geometries.

The compressive bellows assembly 650 includes bellows 612, an upper bellows ring 605, and a stepped portion 602. The bellows 612 are similar to the bellows 412 described herein. The upper bellows ring 605 is disposed on top of the top surface 455 of the second cylindrical lower portion 220 of the lower shield body 229. The upper bellows ring 605 extends radially inwards from the top surface 455 of the second cylindrical lower portion 220. The bellows 612 are connected to a bottom side of the upper bellows ring 605. The stepped portion 602 is a Z-shaped portion. The stepped portion 602 includes a lower horizontal portion 616, a vertical portion 606, and an upper horizontal portion 607. The lower horizontal portion 616 is connected to the bottom portion of the bellows 612. The lower horizontal portion 616 extends radially inwards from the bellows 612. The vertical portion 606 is attached to the lower horizontal portion 616 radially inwards of the bellows 612. The vertical portion 606 of the stepped portion 602 extends upwards from the distal end of the lower horizontal portion 616. The upper horizontal portion 607 is disposed on top of the vertical portion 606. The upper horizontal portion 607 extends radially inwards of the vertical portion 606 of the stepped portion 602. The upper horizontal portion 607 has a lower surface that defines the upper sealing surface 420.

The bellows 612 of the compressive bellows assembly 650 is configured to be compliant in at least one direction, such as the vertical direction (i.e., Z-direction), and is configured to prevent gas from passing therethrough during processing. The bellows assembly 650 may be a stainless steel or Inconel bellows assembly that is welded at opposing ends to the upper bellows ring 605 and the stepped portion 602. The compliant nature of the bellows assembly 250 allows any misalignment or planarity differences between the chuck sealing surface 422 of the stepped sealing ring 264 and the upper sealing surface 420 of the process chamber wall to be taken up so that a reliable and repeatable seal can be formed at the upper sealing surface 420. In the embodiment of FIGS. 6A-6E, the compressive bellows assembly 650 contracts during sealing of the process chamber volume 278.

The bellows stopper 608 is attached to the annular portion 272 of the lower shield body 229, such that the bellows stopper 608 is disposed on the bottom of the annular portion 272. The bellows stopper 608 has a bellows receiving surface 640. The bellows receiving surface 640 stops the expansion of the bellows 612 when the modified support chuck 624a is in a lowered position below a processing position and the bellows are in an expanded state. The bellows receiving surface 640 is sized to receive the lower horizontal portion 616 of the stepped portion 602.

The modified cover ring 611a includes an upper member 614a and a lower member 615a. The upper member 614a is a horizontal member. The lower member 615a is a vertical member. The lower member 615a extends downwards from the radially outward distal end of the upper member 614a. The lower member 615a is disposed radially between the second cylindrical lower portion 220 and the first cylindrical lower portion 221 of the lower shield body 229. The upper member 614a extends over the entirety of the bellows assembly 650 and at least part of the modified edge ring 628a. The upper member 614a includes a horizontal contact surface 274 disposed on the bottom side of the upper member 614a. The upper member 614a further includes a downward protrusion 652. The downward protrusion 652 is disposed on the horizontal contact surface 274 and extends from the upper member 614a, such that the downward protrusion 652 contacts the top surface of the upper horizontal portion 607.

The modified edge ring 628a is disposed on the outer ledge 266 of the modified support chuck 624a. The modified edge ring 628a is similar to the edge ring 228 of FIGS. 1-5. The modified edge ring 628a includes an inner top surface 636, an intermediate top surface 624, and an outer top surface 634. The inner top surface 636 is disposed radially inward of both the intermediate top surface 624 and the outer top surface 634. The inner top surface 636 is coplanar with the substrate support surface 223. The intermediate top surface 624 is disposed radially inward of the outer top surface 634. The intermediate top surface 624 is a curved top surface, such that the intermediate top surface 624 forms a groove between the inner top surface 636 and the outer top surface 634. The outer top surface 634 is sized to receive at least part of the horizontal contact surface 274 of the modified cover ring 611a. The inner top surface 636 is disposed above the outer top surface 634.

The modified support chuck 624a is similar to the support chucks 224a-b, except that the sealing ring is an extension of the outer ledge 266, such that the chuck sealing surface 422 is coplanar with the outer ledge 266 of the modified support chuck 624a.

When the modified support chuck 624a is raised to a processing position, the upper sealing surface 420 of the compressive bellows assembly 650 contacts the chuck sealing surface 422 and the bellows 612 are compressed. When the bellows 612 are compressed, the modified cover ring 611a is raised. Although not shown in FIG. 6A, the modified edge ring 628a may contact the horizontal contact surface 274 of the modified cover ring 611a.

Figure 6B:
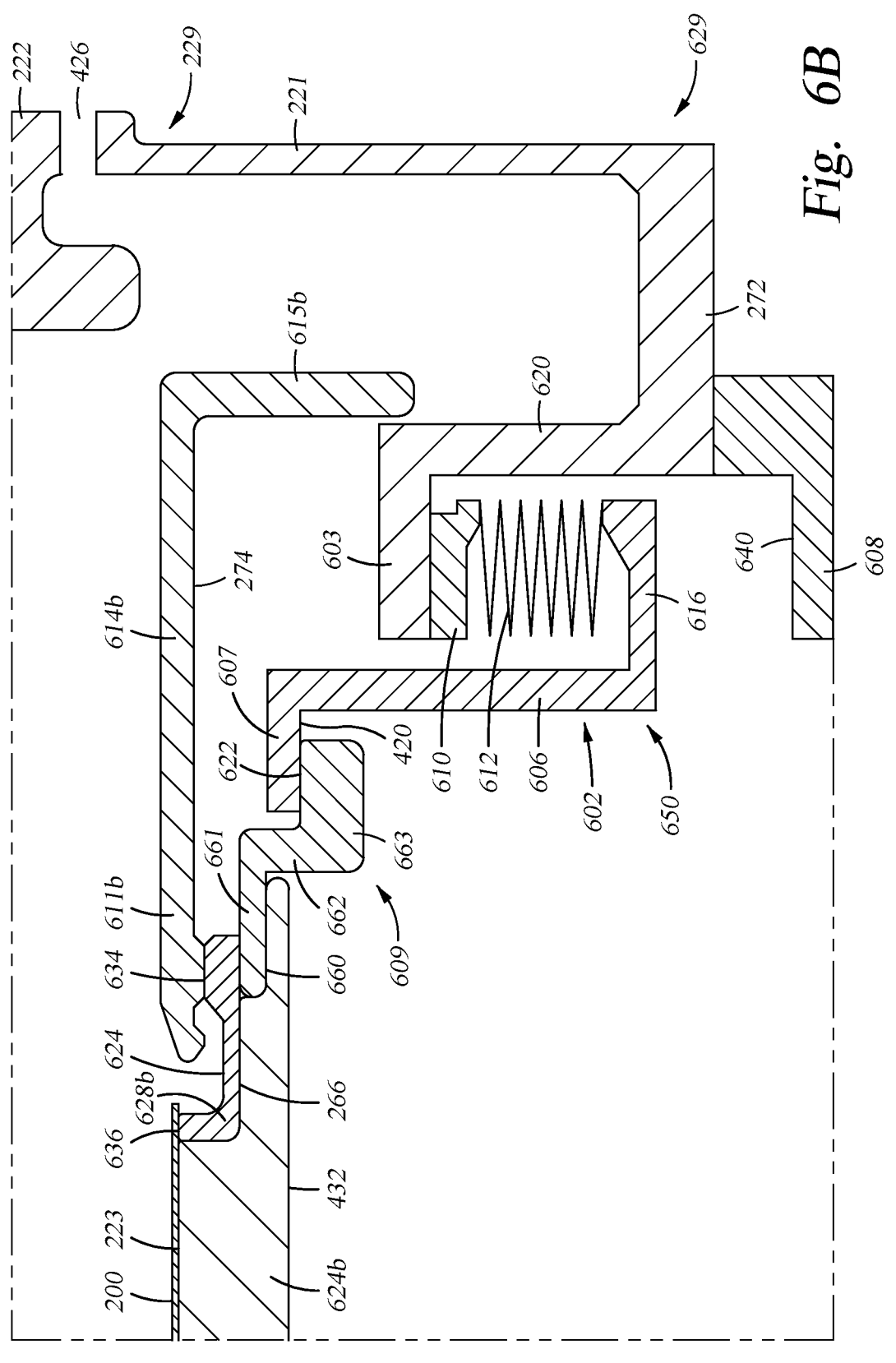

In FIG. 6B, a second alternative embodiment is depicted. The second alternative embodiment has a modified lower shield body 629. The modified lower shield body 629 has the compressive bellows assembly 650 and the bellows stopper 608 attached thereon. The second alternative embodiment also includes a modified cover ring 611b, a modified edge ring 628b, and a modified support chuck 624b. The modified cover ring 611b, the modified edge ring 628b, and the modified support chuck 624b have similar material compositions to the cover ring 210, the edge ring 228, and the support chuck 224 described herein, but include modified geometries.

The modified lower shield body 629 is similar to the lower shield body 229 described in FIGS. 1-5, but has a modified second cylindrical lower portion 620 and a horizontal bellows attachment portion 603. The modified second cylindrical lower portion 620 is similar to the second cylindrical lower portion 220 described herein, but the second cylindrical lower portion 220 is extended and the horizontal bellows attachment portion 603 is disposed thereon. The horizontal bellows attachment portion 603 is a horizontal portion extending radially inward from the modified second cylindrical lower portion 620. The horizontal bellows attachment portion 603 has a modified upper bellows ring 610 disposed on the bottom thereof.

The compressive bellows assembly 650 includes bellows 612, the modified upper bellows ring 610, and the stepped portion 602. The bellows 612 are similar to the bellows 412 described herein. The modified upper bellows ring 610 is disposed on the bottom surface of the horizontal bellows attachment portion 603. The bellows 612 are connected to a bottom side of the modified upper bellows ring 610. The stepped portion 602 is a Z-shaped portion. The stepped portion 602 includes the lower horizontal portion 616, the vertical portion 606, and the upper horizontal portion 607. The lower horizontal portion 616 is connected to the bottom portion of the bellows 612. The lower horizontal portion 616 extends radially inwards from the bellows 612. The vertical portion 606 is attached to the lower horizontal portion 616 radially inwards of the bellows 612. The vertical portion 606 of the stepped portion 602 extends upwards from the distal end of the lower horizontal portion 616. The upper horizontal portion 607 is disposed on top of the vertical portion 606. The upper horizontal portion 607 extends radially inwards of the vertical portion 606 of the stepped portion 602. The upper horizontal portion 607 has a lower surface that defines the upper sealing surface 420.

The bellows stopper 608 is attached to the annular portion 272 of the lower shield body 229. The bellows stopper 608 is similar to the bellows stopper 608 described in FIG. 6A.

The modified cover ring 611b includes an upper member 614b and a lower member 615b. The upper member 614b is a horizontal member. The lower member 615b is a vertical member. The lower member 615b extends downwards from the radially outward distal end of the upper member 614b. The lower member 615b is disposed radially between the second cylindrical lower portion 220 and the first cylindrical lower portion 221 of the lower shield body 629. The upper member 614b extends over the entirety of the bellows assembly 650 and at least part of the modified edge ring 628b. The upper member 614b includes a horizontal contact surface 274 disposed on the bottom side of the upper member 614b.

The modified edge ring 628b is similar to the modified edge ring 628a of FIG. 6A. The modified edge ring 628b is disposed on the outer ledge 266 of the modified support chuck 624b. The outer top surface 634 of the modified edge ring 628b is sized to receive at least part of the horizontal contact surface 274 of the modified cover ring 611b.

The modified support chuck 624b is similar to the support chucks 224a-b, except that the support chuck 624b includes a skirt support surface 660 disposed radially outwards from the outer ledge 266. The skirt support surface 660 is disposed below the outer ledge 266 and supports a support chuck skirt 609.

The support chuck skirt 609 includes a support element 661, a stepped element 662, and a contact element 663. The support element 661 is disposed on top of the skirt support surface 660 of the modified support chuck 624b. The support element 661 extends radially outward from the skirt support surface 660 of the modified support chuck 624b. The stepped element 662 is disposed vertically downward from the support element 661. The contact element 663 is connected to and disposed radially outward from the bottom distal end of the stepped element 662. The contact element 663 includes an upper contact surface 622. The upper contact surface 622 is sized to contact the upper sealing surface 420 of the compressive bellows assembly 650.

When the modified support chuck 614b is raised to a processing position, the upper sealing surface 420 of the compressive bellows assembly 650 contacts the upper contact surface 622 and the bellows 612 are compressed. When the bellows 612 are compressed, the modified cover ring 611b is raised by contacting the outer top surface 634 of the modified edge ring 628b.

Figure 6C:
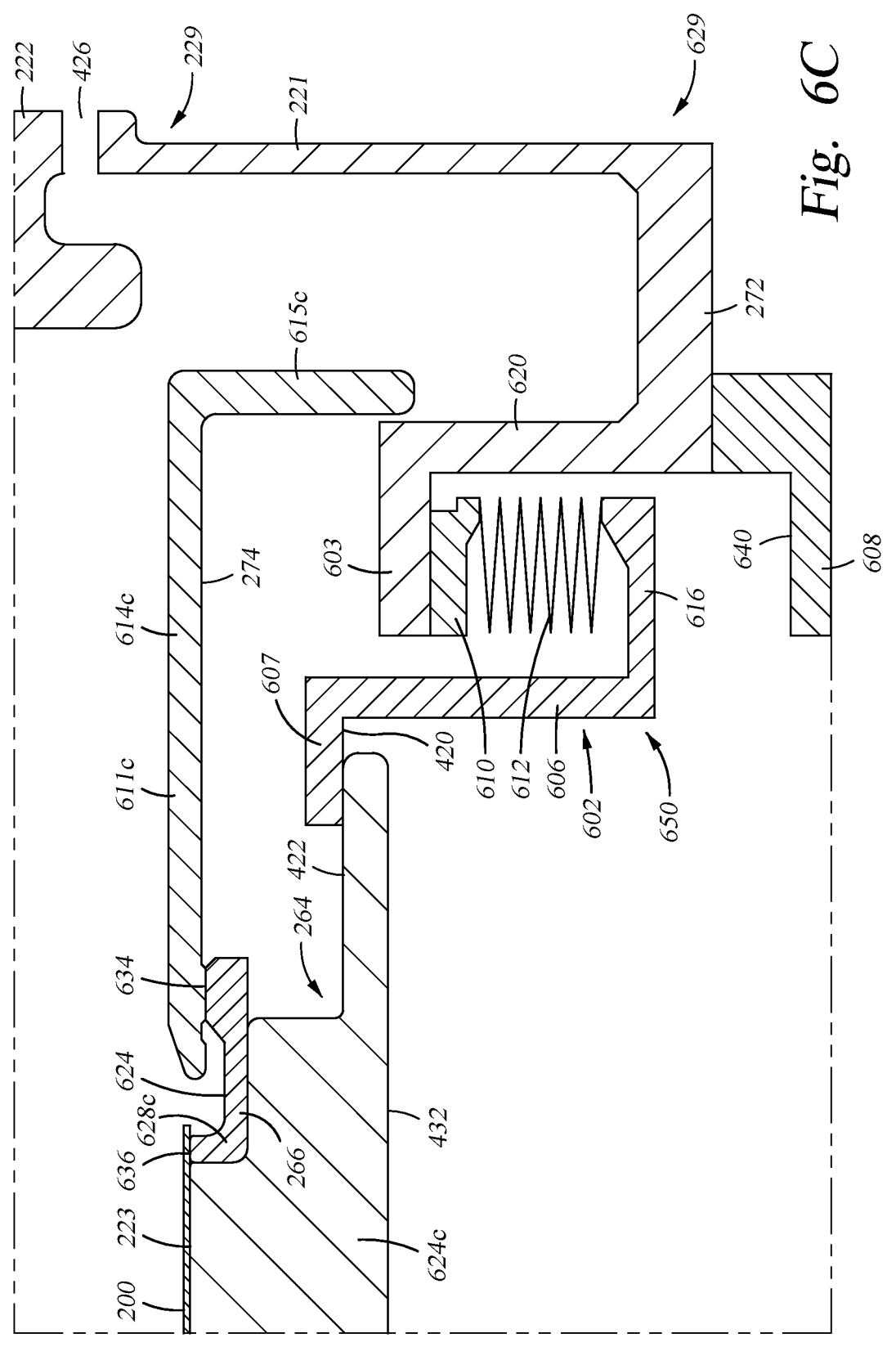

In FIG. 6C, a third alternative embodiment is depicted. The third alternative embodiment has a modified lower shield body 629. The modified lower shield body 629 is the same modified lower shield body 629 of FIG. 6B. The modified lower shield body 629 includes the compressive bellows assembly 650, described in FIG. 6B and the corresponding text, and the bellows stopper 608, described in FIGS. 6A-6B and the corresponding text, attached thereon. The third alternative embodiment also includes a modified cover ring 611c, a modified edge ring 628c, and a modified support chuck 624c. The modified cover ring 611c, a modified edge ring 628c, and a modified support chuck 624c have similar material compositions to the cover ring 210, the edge ring 228, and the support chuck 224 described herein, but include modified geometries.

The modified cover ring 611c includes an upper member 614c and a lower member 615c. The upper member 614c is a horizontal member. The lower member 615c is a vertical member. The lower member 615c extends downwards from the radially outward distal end of the upper member 614c. The lower member 615c is disposed radially between the second cylindrical lower portion 220 and the first cylindrical lower portion 221 of the lower shield body 629. The upper member 614c extends over the entirety of the bellows assembly 650 and at least part of the modified edge ring 628c. The upper member 614c includes a horizontal contact surface 274 disposed on the bottom side of the upper member 614c.

The modified edge ring 628c is similar to the modified edge rings 628a, 628b of FIGS. 6A-6B. The modified edge ring 628c is disposed on the outer ledge 266 of the modified support chuck 624c. The outer top surface 634 of the modified edge ring 628c is sized to receive at least part of the horizontal contact surface 274 of the modified cover ring 611c.

The modified support chuck 624c is similar to the support chucks 224a-b, except that the stepped sealing ring 264 described herein is a continuous portion of the modified support chuck 624c. The chuck sealing surface 422 of the stepped sealing ring 264 is sized to contact the upper sealing surface 420 of the compressive bellows assembly 650.

When the modified support chuck 614c is raised to a processing position, the upper sealing surface 420 of the compressive bellows assembly 650 contacts the chuck sealing surface 422 and the bellows 612 are compressed. When the bellows 612 are compressed, the modified cover ring 611c is raised by contacting the outer top surface 634 of the modified edge ring 628c.

Figure 6D:
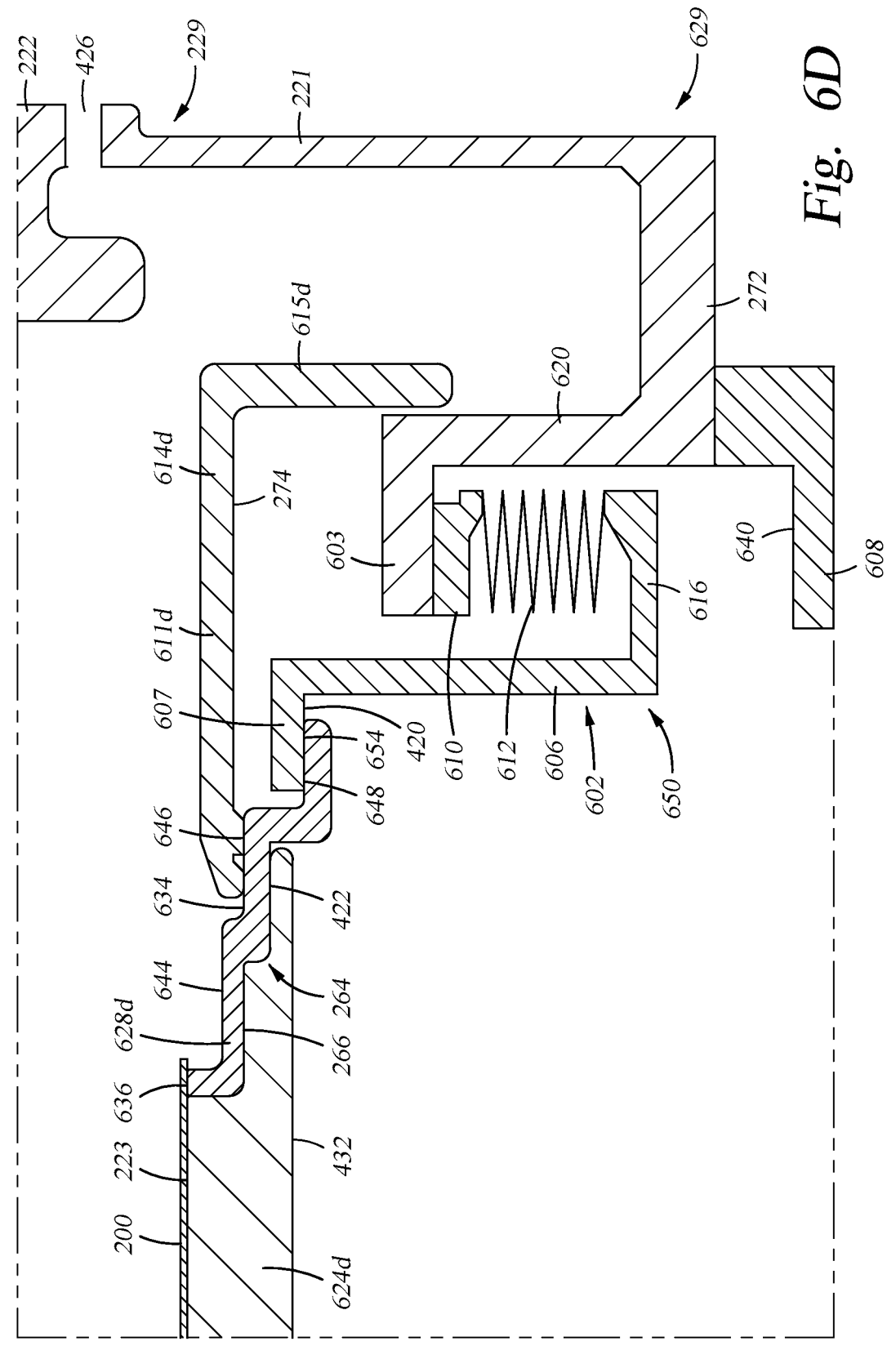

In FIG. 6D, a fourth alternative embodiment is depicted. The fourth alternative embodiment has the modified lower shield body 629. The modified lower shield body 629 is the same modified lower shield body 629 of FIG. 6B. The modified lower shield body 629 includes the compressive bellows assembly 650, described in FIG. 6B and the corresponding text, and the bellows stopper 608, described in FIGS. 6A-6B and the corresponding text, attached thereon. The fourth alternative embodiment also includes a modified cover ring 611d, a modified edge ring 628d, and a modified support chuck 624d. The modified cover ring 611d, the modified edge ring 628d, and the modified support chuck 624d have similar material compositions to the cover ring 210, the edge ring 228, and the support chuck 224 described herein, but include modified geometries.

The modified cover ring 611d includes an upper member 614d and a lower member 615d. The upper member 614d is a horizontal member. The lower member 615d is a vertical member. The lower member 615d extends downwards from the radially outward distal end of the upper member 614d. The lower member 615d is disposed radially between the second cylindrical lower portion 220 and the first cylindrical lower portion 221 of the lower shield body 629. The upper member 614d extends over the entirety of the bellows assembly 650 and at least part of the modified edge ring 628d. The upper member 614d does not extend past the stepped sealing ring 264 of the modified support chuck 624d. The upper member 614d includes a horizontal contact surface 274 disposed on the bottom side of the upper member 614d.

The modified edge ring 628d is disposed on the outer ledge 266 of the modified support chuck 624d. The modified edge ring 628d includes an inner top surface 636, a first step 644, a second step 646, and a third step 648. The first step 644 is a horizontal surface disposed parallel to the outer ledge 266 and above the outer ledge 266. The second step 646 is a horizontal surface parallel to the outer ledge 266 and disposed vertically below the first step 644. The second step 646 may be coplanar with the outer ledge 266. The second step 646 includes the outer top surface 634 sized to receive at least part of the horizontal contact surface 274 of the modified cover ring 611d. The third step 648 is a horizontal surface parallel to the outer ledge 266 and disposed vertically below the second step 646. The third step 648 may be coplanar with the bottom chuck surface 432 or may be disposed beneath the bottom chuck surface 432. The third step 648 includes a bellows support surface 654. The bellows support surface 654 is the top surface of the third step 648 and is sized to receive and support the upper sealing surface 420 of the upper horizontal portion 607.

The modified support chuck 624d is similar to the support chucks 224a-b, except that the stepped sealing ring 264 described herein is a continuous portion of the modified support chuck 624d. In the modified support chuck 624d, the chuck sealing surface 422 of the stepped sealing ring 264 is sized to contact the bottom surface of the second step 646 of the modified edge ring 628d.

When the modified support chuck 614d is raised to a processing position, the upper sealing surface 420 of the compressive bellows assembly 650 contacts the bellows support surface 654 and the bellows 612 are compressed. When the bellows 612 are compressed, the modified cover ring 611d is raised by contacting the outer top surface 634 of the modified edge ring 628d.

Figure 6E:
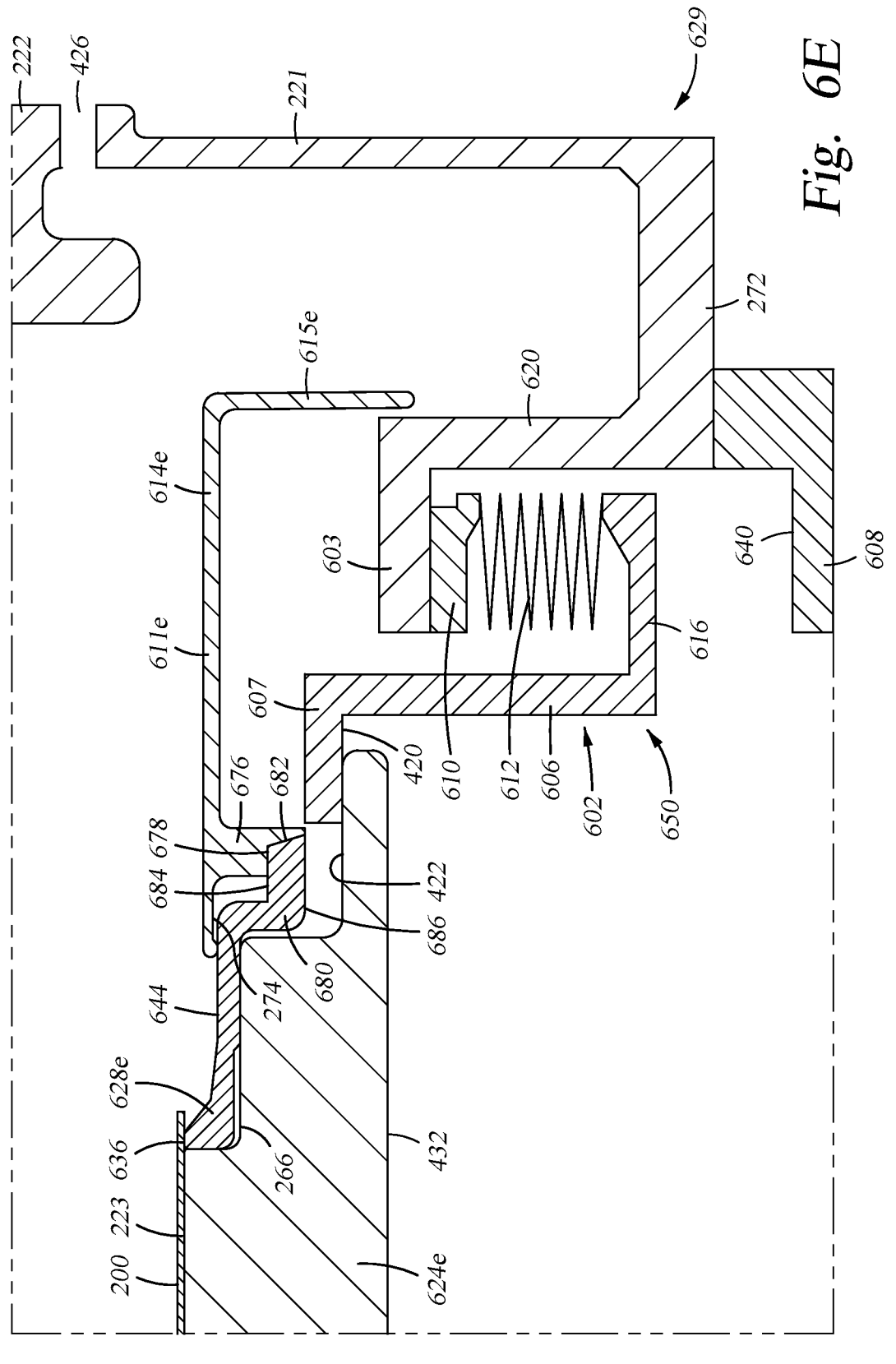

In FIG. 6E, a fifth alternative embodiment is depicted. The fifth alternative embodiment has the modified lower shield body 629. The modified lower shield body 629 is the same modified lower shield body 629 of FIG. 6B. The modified lower shield body 629 includes the compressive bellows assembly 650, described in FIG. 6B and the corresponding text, and the bellows stopper 608, described in FIGS. 6A-6B and the corresponding text, attached thereon. The fifth alternative embodiment also includes a modified cover ring 611e, a modified edge ring 628e, and a modified support chuck 624e. The modified cover ring 611e, the modified edge ring 628e, and the modified support chuck 624e have similar material compositions to the cover ring 210, the edge ring 228, and the support chuck 224 described herein, but include modified geometries.

The modified cover ring 611e includes an upper member 614e and a lower member 615e. The upper member 614e is a horizontal member. The lower member 615e is a vertical member. The lower member 615e extends downwards from the radially outward distal end of the upper member 614e. The lower member 615e is disposed radially between the second cylindrical lower portion 620 and the first cylindrical lower portion 221 of the lower shield body 629. The upper member 614e extends over the entirety of the bellows assembly 650 and at least part of the modified edge ring 628e. The upper member 614d has a protrusion 676 with a second bottom contact surface 678. The upper member 614e includes a horizontal contact surface 274 disposed on the bottom side of the upper member 614e. The horizontal contact surface 274 contacts at least part of the modified edge ring 628e. The protrusion 676 extends downwards from the horizontal contact surface 274 of the upper member 614e. The second bottom contact surface 678 is on the bottom end of the protrusion 676 and is shaped to interact with an outer ledge 680 of the modified edge ring 628e. The second bottom contact surface 678 contacts the outer edge ring surface 682 and a top ledge surface 684 of the outer ledge 680.

The modified edge ring 628e is disposed on the outer ledge 266 of the modified support chuck 624e. The modified edge ring 628e includes an inner top surface 636, a first step 644, and an outer ledge 680. The inner top surface 636 is similar to the inner top surface 636 described in FIG. 6A. The first step 644 is a horizontal surface disposed parallel to the outer ledge 266 of the modified support chuck 624e and above the outer ledge 266. The outer ledge 680 is a ledge disposed vertically below the first step 644. The outer ledge 680 includes a top ledge surface 684 and an outer edge ring surface 682. The outer edge ring surface 682 is a slanted surface connected to and disposed radially outward of the top ledge surface 684. The top ledge surface 684 is a horizontal surface disposed radially outward of the first step 644. The top ledge surface 684 is disposed radially outward of and vertically offset from the outer ledge 266 of the modified support chuck 624e. The top ledge surface 684 and the outer edge ring surface 682 are disposed over the chuck sealing surface 422 of the stepped sealing ring on the modified support chuck 624e. The modified edge ring 628e includes a lower ledge surface 686. The lower ledge surface 686 is the lower surface of the outer ledge 680. The lower ledge surface 686 is disposed below the top ledge surface 684 and the outer edge ring surface 682. The lower ledge surface 686 is vertically offset from the chuck sealing surface 422, such that the lower ledge surface 686 is free floating.

The modified support chuck 624e is similar to the support chucks 224a-b, except that the stepped sealing ring 264 described herein is a continuous portion of the modified support chuck 624e. In the modified support chuck 624e, the chuck sealing surface 422 of the stepped sealing ring 264 is sized to contact the upper sealing surface 420 of the compressive bellows assembly 650.

When the modified support chuck 614e is raised to a processing position, the upper sealing surface 420 of the compressive bellows assembly 650 contacts the chuck sealing surface 422 and the bellows 612 are compressed. When the bellows 612 are compressed, the modified cover ring 611e is raised by contacting the first step 644 and the top ledge surface 684 of the modified edge ring 628e.

In some embodiments, the modified support chucks 624a-e may have cavities formed in the bottom chuck surface 432. The cavities may be pockets within the modified support chucks 624a-e and may extend as far out as underneath the outer ledge 266. The upper horizontal portion 607 of the stepped portion 602 of the bellows assembly 650 is considered a process chamber wall. The process chamber walls may be any wall defining the chamber volume in the processing assembly 160. In some embodiments, additional process chamber walls include the sputtering target assembly 203, the containment member 208, and the bellows 612.

If not otherwise described herein, the components not shown in FIGS. 6A-6E are the same as the components described in FIGS. 1-5. In some embodiments, some components described in FIGS. 6A-6E, and the accompanying text, are combinable with embodiments described in FIGS. 1-5.

Figures 7, 8:
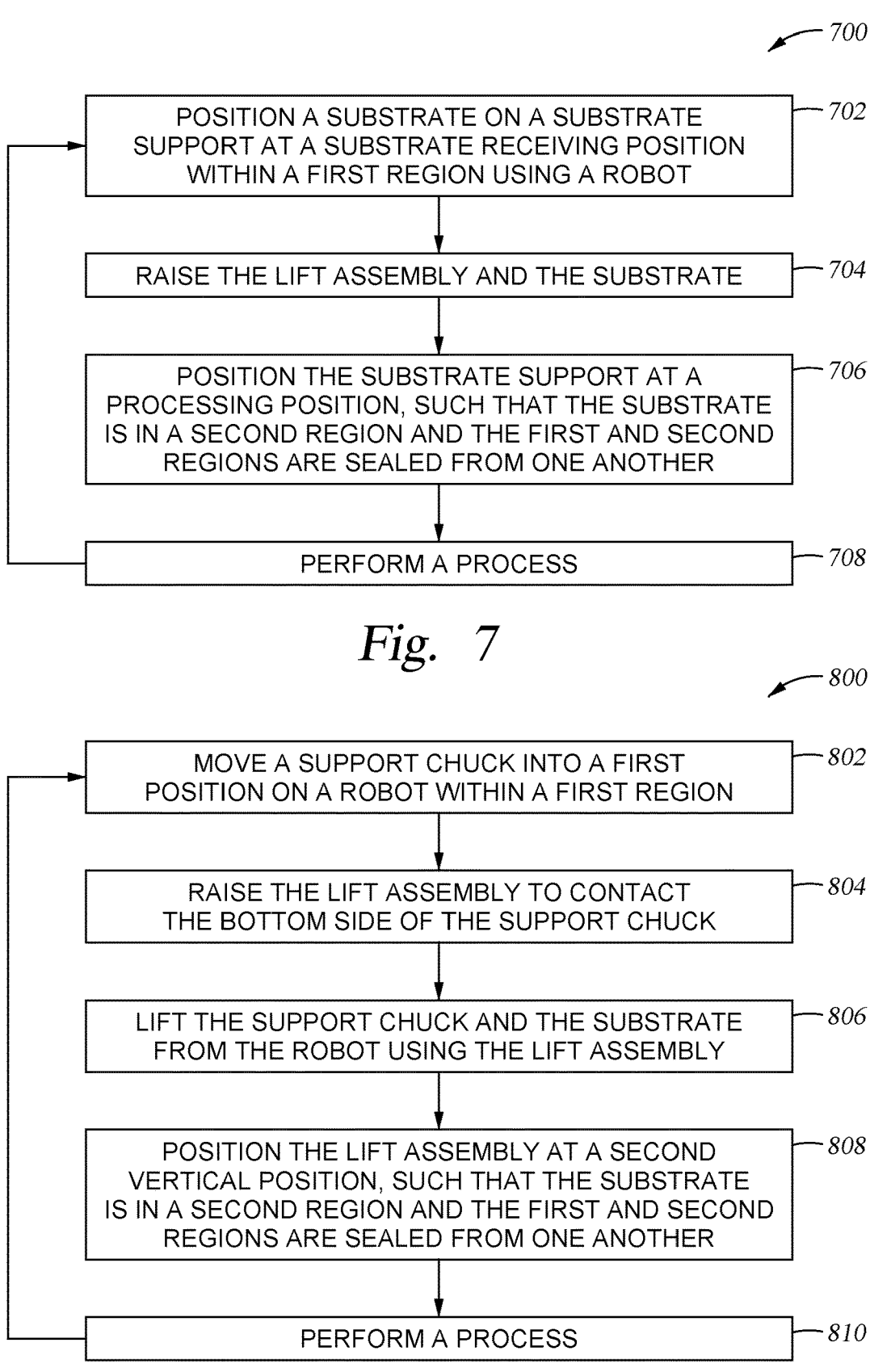
FIG. 7 is a method of transferring a substrate within the transfer volume and the chamber volume of FIGS. 2A-2B.
FIG. 8 is a method of transferring a substrate within the transfer volume and the chamber volume of FIGS. 3A-3B.

FIG. 7 depicts a method 700 of transferring a substrate within the transfer volume 236 and the chamber volume 278 of FIGS. 2A-2B. The method 700 is enabled by the apparatus described in FIGS. 2A-2B. In some embodiments, the method 700 may include additional process operations other than those described herein.

The first operation 702 of the method 700 is positioning a substrate, such as the substrate 200, on a substrate support at a substrate receiving position within a first region using a robot. In the first operation 702, the substrate support is the substrate support surface 223 of the support chuck 224a. The substrate receiving position is the substrate receiving position of FIG. 2A, wherein the support chuck 224a and the lift assembly 220a are at a lower position in which a substrate 200 may be loaded thereon. The first region is the transfer chamber assembly 150 and the transfer volume 236 formed therein. The robot used in the first operation 702 is the central transfer device 145. The robot may be any suitable substrate transfer robot. The robot transfers the substrate 200 between the processing assemblies 160. The pressure in which the substrate 200 is exposed during the first operation 702 is a transfer volume pressure. The transfer volume pressure is about $10^{-9}$ Torr to about $10^{-4}$, such as about $10^{-8}$ Torr to about $10^{-5}$ Torr, such as about $10^{-7}$ Torr to about $10^{-6}$ Torr.

The second operation 704 of the method 700 is lifting the substrate support and the substrate from the first vertical position. The lift assembly 220a enables the vertical motion of the substrate support and the substrate. The substrate support and the substrate are lifted at a rate sufficient to expedite the rate of substrate processing, while minimizing damage done to the substrate. The lift assembly 220a and the support chuck 224a are attached to each other and lifted at the same rate for the entirety of the lifting operation.

The third operation 706 of the method 700 is positioning the substrate support at a processing position, such that the substrate is in a second region and the first and second regions are sealed from one another. In the third operation 706, the substrate support and the substrate are lifted so that the substrate support and the substrate are in a processing position as shown in FIG. 2B. In the processing position, the bellows assembly 250 is in contact with the support chuck 224a and a seal is formed between the transfer volume 236 and the chamber volume 278. In this embodiment, the transfer volume 236 is the first region and the chamber volume 278 is the second region. Providing a seal between the transfer volume 236 and the chamber volume 278 enables the chamber volume 278 to be pumped to a different pressure than the transfer volume 236. Pumping the chamber volume 278 to a different pressure allows different processes to be performed within each of the processing assemblies 160 within the cluster tool assemblies 100a, 100b.

The fourth operation 708 of the method 700 is performing a substrate fabrication process. The substrate fabrication process is one of a PVD, CVD, ALD, etch, cleaning, heating, annealing, and/or polishing process. The substrate fabrication process is performed in the chamber volume 278. Within the chamber volume 278 described in FIGS. 2-6, the substrate fabrication process is a PVD process. The PVD process produces thin films and coating on the substrate 200. The PVD process may deposit tantalum, copper, aluminum, cobalt, ruthenium, molybdenum, zinc, chromium, gold, palladium, titanium, silicon or other metals and metal containing compounds.

After performing the process in the fourth operation 708 on the substrate, chamber volume 278 may be purged and the support chuck 224a is lowered back to the substrate receiving position. A robot removes the support substrate 200 from the support chuck 224a and the method 700 is repeated with a different substrate. In some embodiments, a single processing assembly 160 may process a substrate multiple times during the life of the substrate.

FIG. 8 is a method 800 of transferring a substrate 200 within the transfer volume 236 and the chamber volume 278 of FIGS. 3A-3B. The method 800 is enabled by the apparatus described in FIGS. 3A-3B. In some embodiments, the method 800 includes additional process operations other than those described herein.

The first operation 802 of the method 800 is moving a support chuck, such as the support chuck 224b, into a first position on a robot within a first region. In the first operation 802, the first position is a loading position above a lift assembly, such as the lift assembly 220b. The support chuck 224b is transported between the processing assemblies 160 along with a substrate, such as the substrate 200, and is detached from the lift assembly 220b during the first operation 802. The support chuck 224b is positioned above the lift assembly 220b, such that the lift assembly 220b is disposed completely underneath the support chuck 224b. The first region is the transfer volume 236 within the transfer chamber assembly 150. The robot which transports the substrate chuck is the central transfer device 145.

While a carousel is shown in FIGS. 3A-3B, the central transfer device 145 may be replaced with other suitable substrate and substrate chuck transfer devices. The transfer devices are equipped to transport both the substrate chuck and the substrate within the first region.

In the second operation 804 of the method 800, the lift assembly is raised to contact the bottom side of the support chuck. The lift assembly couples to the bottom side of the support chuck, such that the lift assembly and the support chuck are securely connected to one another. The lift assembly passes through a central opening in the robot arm coupled to the support chuck in order to contact the bottom side of the support chuck. The lift assembly also provides an electrical connection and a gas connection to the support chuck. While the lift assembly is raised to contact the bottom side of the support chuck, the support chuck is still connected to and disposed on the robot.

During the second operation 804, the support chuck is electrically connected to both the lift assembly and the robot, such that the support chuck may constantly provide heating and chucking to the substrate. Constant heating and chucking of the substrate assists in the substrate maintaining a constant temperature and minimizes damage to the backside of the substrate caused by sliding of the substrate. While both the lift assembly and the robot provide an electrical connection for the powering of the support chuck, the powering of the support chuck switches from the robot to the lift assembly during the second operation 804.

In the third operation 806 of the method 800, the support chuck and the substrate are lifted from the robot by the lift assembly. During the third operation 806, the support chuck is decoupled from the robot. The lift assembly raises the support chuck and the substrate disposed on top of the support chuck vertically upwards, such that the support chuck and the substrate travel through the first region towards a second region.

In the fourth operation 808 of the method 800, the lift assembly is positioned at a second vertical position, such that the substrate is in a second region and the first and second regions are sealed from one another. In the fourth operation 808, the support chuck and the substrate are lifted by the lift assembly so that the support chuck and the substrate are in a processing position as shown in FIG. 3B. In the processing position, the bellows assembly 250 is in contact with the support chuck 224b and a seal is formed between the transfer volume 236 and the chamber volume 278. In this embodiment, the transfer volume 236 is the first region and the chamber volume 278 is the second region. Providing a seal between the transfer volume 236 and the chamber volume 278 enables the chamber volume 278 to be pumped to a different pressure than the transfer volume 236. Pumping the chamber volume 278 to a different pressure allows different processes to be performed within each of the processing assemblies 160 within the cluster tool assemblies 100a, 100b.

The fifth operation 810 of the method 800 is performing a substrate fabrication process. The substrate fabrication process is one of a PVD, CVD, ALD, etch, cleaning, heating, annealing, and/or polishing process. The substrate fabrication process is performed in the chamber volume 278. Within the chamber volume 278, described in FIGS. 2-6, the substrate fabrication process is a PVD process. The PVD process produces thin films and coating on the substrate 200. The PVD process may deposit zinc, chromium, gold, palladium, titanium, copper, or other metals and metal containing compounds.

After performing the process in the fifth operation 810 on the substrate 200, the chamber volume 278 may be purged and the support chuck 224a is lowered back to the substrate receiving position. A robot removes the support chuck 224a from the lift assembly and the method 800 is repeated with a different substrate. In some embodiments, a single processing assembly 160 may process a substrate multiple times during the life of the substrate.

Elements of the methods 700, 800 may be combined. The methods described herein are capable of being performed by the apparatus described in FIGS. 1-6. The methods described herein are also imagined to be able to be completed using alternative apparatus.

Embodiments disclosed herein are directed towards apparatus for substrate processing and a cluster tool including a transfer chamber assembly and a plurality of processing assemblies. The present disclosure generally provides a substrate processing tool with increased process condition flexibility between process assemblies within the same cluster tool.

In the present disclosure, a substrate and optionally a support chuck are transported between processing assemblies within a transfer volume formed by a transfer chamber assembly. The processing assemblies include processing volumes in which the substrate is processed. The support chuck may optionally detach from a lift assembly while being transported between processing assemblies. When the substrate and the support chuck are disposed on the lift assembly, the lift assembly raises the substrate and support chuck to an upper processing position. While in the upper processing position, surfaces of the processing assembly and the support chuck seal against one another to form a fluidly isolated processing volume. The processing volume is fluidly isolated from the transfer volume formed by the transfer chamber assembly.

The isolation of the processing volume from the transfer volume by the movement of the lift assembly allows for each of the processing volumes to be adjusted to different pressures and enables different substrate processing steps to be performed within each of the processing assemblies within the transfer chamber assembly. Different processing steps may be performed in each of the processing volumes even when each processing step requires different pressures and temperatures. The use of the support chuck as the sealing member within the processing assembly also minimizes the volume of the processing volume. Minimizing the processing volume decreases the amount of process gases and purge gases required during each process. The sealing between each processing volume and the transfer volume additionally minimizes process gas leakage into the transfer chamber.

While the foregoing is directed to embodiments of the present disclosure, other and further embodiments of the disclosure may be devised without departing from the basic scope thereof, and the scope thereof is determined by the claims that follow.

The invention claimed is:

1. An apparatus configured to simultaneously process a plurality of substrates, comprising:
   a transfer chamber having a transfer device disposed in a transfer volume; and
   a plurality of processing chambers, wherein each processing chamber is in communication with the transfer volume when a corresponding processing chamber is in a transfer position, wherein each processing chamber comprises:
   one or more process chamber walls that partially define a process chamber volume;
   a lift assembly having a shaft coupled to a support chuck, the lift assembly configured to move the support chuck with the shaft between the transfer position and a processing position; and
   a bellows assembly, the bellows assembly comprising:
   a ring;
   a bellows disposed radially outward of the support chuck; and
   a stepped portion coupled to the ring by the bellows, the stepped portion comprising an upper sealing surface, wherein:
   the upper sealing surface is in contact and forms an isolation seal with a chuck sealing surface of the support chuck when the support chuck is in the processing position, the isolation seal forming a sealed process chamber volume from the process chamber volume,
   the sealed process chamber volume is fluidly isolated from the transfer volume,
   the sealed process chamber volume is formed of the partially defined process chamber volume, the bellows assembly, and the support chuck when the support chuck is in the processing position, and
   the support chuck is separated from the bellows assembly when the support chuck is in the transfer position.

2. The apparatus of claim 1, wherein the transfer device is configured (Rejoined) to transfer the support chuck in and out of the processing chamber.

3. The apparatus of claim 2, wherein the transfer device is configured to supply power to the support chuck during transfer.

4. The apparatus of claim 1, wherein the transfer volume is in fluid communication with a first vacuum pump and the process chamber volume is in fluid communication with a second vacuum pump.

5. An apparatus configured to simultaneously process a plurality of substrates, comprising:
   one or more processing chambers, wherein each of the processing chambers comprises:

one or more process chamber walls that partially define a process chamber volume;

a transfer volume; a support chuck configured to translate between the process chamber volume and the transfer volume, the support chuck comprising:

a substrate supporting surface; and a chuck sealing surface disposed around the substrate supporting surface of the support chuck;

a magnetron disposed opposite the process chamber volume from the support chuck;

a lift assembly disposed in the transfer volume, the lift assembly having a shaft coupled to the support chuck, the lift assembly configured to move the support chuck through the transfer volume, between a transfer position and a processing position; and a bellows assembly comprising:

a ring;

a bellows disposed radially outward of the support chuck; and a stepped portion coupled to the ring by the bellows, the stepped portion comprising an upper sealing surface, wherein:

the bellows assembly is separated from the lift assembly in the transfer position, the upper sealing surface is in contact and forms an isolation seal with the chuck sealing surface of the support chuck and the bellows when the support chuck is in the processing position, the isolation seal forming a sealed process chamber volume that is fluidly isolated from the transfer volume when the support chuck is in the processing position, the support chuck separated from the upper sealing surface when the support chuck is in the transfer position, the sealed process chamber volume is formed of the partially defined process chamber volume, the bellows assembly, and the support chuck, and the transfer volume is in fluid communication with the partially defined process chamber volume when the support chuck is in the transfer position.

6. The apparatus of claim 5, wherein a transfer device is further configured to transfer the support chuck between the one or more processing chambers.

7. The apparatus of claim 6, wherein the transfer device is configured to supply power to the support chuck during transfer between the one or more processing chambers.

8. The apparatus of claim 7, wherein the support chuck is attachable to both the lift assembly and the transfer device.

9. The apparatus of claim 5, wherein the chuck sealing surface and the upper sealing surface have an overlapping annular surface area and form the isolation seal.

10. The apparatus of claim 5, further comprising:

an edge ring that comprises an annular top surface; and a cover ring that is disposed within the chamber volume, the cover ring comprising a horizontal contact surface having an annular surface, the annular surface overlapping with the annular top surface.

11. The apparatus of claim 5, wherein the chuck sealing surface has a surface roughness of less than or equal to about 10 Ra and the upper sealing surface has a surface roughness of less than or equal to about 10 Ra.

12. The apparatus of claim 5, wherein the bellows has a spring constant of 55 lbf/in to about 75 lbf/in while at a temperature of about 350 degrees C. to about 600 degrees C.

13. An apparatus configured to simultaneously process a plurality of substrates, comprising:

a processing chamber having one or more walls that form a partially defined substrate processing volume and at least a portion of a substrate transfer volume;

a lift assembly having a support chuck coupled to a shaft of the lift assembly, the support chuck disposed within the substrate transfer volume when the support chuck is in a transfer position; and a bellows assembly coupled to the one or more walls, the bellows assembly comprising:

a ring;

a bellows disposed radially outward of the support chuck; and a stepped portion disposed between the bellows and a chuck sealing surface of the support chuck, the stepped portion coupled to the ring by the bellows, the stepped portion comprising an upper sealing surface, wherein:

the upper sealing surface contacts and forms an isolation seal with the chuck sealing surface of the support chuck when the support chuck is in a processing position, the isolation seal forming a sealed process chamber volume, which is fluidly isolated from the substrate transfer volume, the sealed process chamber volume is formed of the partially defined substrate processing volume, the bellows assembly, and the support chuck when the support chuck is in the processing position, and the substrate transfer volume is in fluid communication with the partially defined substrate processing volume when the support chuck is in the transfer position, the support chuck separated from the bellows assembly when in the transfer position and in contact with the bellows assembly when in the processing position.

* * * * *